US012622033B2

(12) United States Patent
Ramkumar et al.

(10) Patent No.: US 12,622,033 B2
(45) Date of Patent: May 5, 2026

(54) METHOD OF INTEGRATING SONOS INTO HKMG FLOW

(71) Applicant: Infineon Technologies LLC, San Jose, CA (US)

(72) Inventors: Krishnaswamy Ramkumar, San Jose, CA (US); Venkatraman Prabhakar, Pleasanton, CA (US)

(73) Assignee: Infineon Technologies LLC, San Jose, CA (US)

( * ) Notice: Subject to any disclaimer, the term of this patent is extended or adjusted under 35 U.S.C. 154(b) by 737 days.

(21) Appl. No.: 17/554,900

(22) Filed: Dec. 17, 2021

(65) Prior Publication Data

US 2023/0081072 A1 Mar. 16, 2023

Related U.S. Application Data

(60) Provisional application No. 63/244,316, filed on Sep. 15, 2021.

(51) Int. Cl.
H10D 64/01 (2025.01)
H10B 43/35 (2023.01)
(Continued)

(52) U.S. Cl.
CPC ........... H10D 64/037 (2025.01); H10B 43/35 (2023.02); *G11C 11/5671* (2013.01); *H10D 30/696* (2025.01)

(58) Field of Classification Search
CPC .... H10D 64/037; H10D 30/696; H10D 30/69; H10B 43/35; H10B 43/40; G11C 11/5671; G11C 16/0466
See application file for complete search history.

(56) References Cited

U.S. PATENT DOCUMENTS 10,062,573 B1 * 8/2018 Ramkumar ............ H10B 43/30
2002/0089877 A1 7/2002 Yi et al.
(Continued)

OTHER PUBLICATIONS

International Search Report for Application No. PCT/US22/43449 dated Feb. 3, 2023; 11 pages.

*Primary Examiner* — Su C Kim

(57) ABSTRACT

A semiconductor device and methods of fabricating the same are disclosed. Generally, the method includes forming a tunnel-dielectric for a memory transistor over a surface of a substrate, forming a nitride charge-trapping layer over the tunnel-dielectric, and forming a gate-dielectric for a field-effect transistor over the surface of the substrate. Forming the gate-dielectric can include performing a number of oxidation processes to form a thick gate-oxide while concurrently forming a blocking-dielectric including an oxide layer over the charge-trapping layer of the memory transistor. In one embodiment, performing the oxidation processes includes performing an in-situ-steam-generation process to form the thick gate-oxide and the oxide layer of the blocking-dielectric, followed by a thermal oxidation process to increase a thickness of the thick gate-oxide and the oxide layer without altering a substantially uniform stoichiometric concentration of nitrogen across a thickness of the charge-trapping layer from the tunnel-dielectric to the blocking-dielectric.

21 Claims, 18 Drawing Sheets

(51) Int. Cl.
　　　*G11C 11/56*　　　　(2006.01)
　　　*H10D 30/69*　　　　(2025.01)

(56)　　　　　　　　References Cited

U.S. PATENT DOCUMENTS

2013/0210209　A1　　8/2013　Ramkumar
2015/0171104　A1　　6/2015　Prabhakar et al.
2016/0099253　A1*　4/2016　Ramkumar .......... H10D 64/037
　　　　　　　　　　　　　　　　　　257/326
2016/0172190　A1*　6/2016　Shih ............... H01L 21/823462
　　　　　　　　　　　　　　　　　　438/745
2017/0194334　A1*　7/2017　Wu ....................... H01L 29/517
2018/0083024　A1　　3/2018　Ramkumar et al.
2018/0166452　A1　　6/2018　Ramkumar
2019/0027486　A1*　1/2019　Wu .................... H10D 30/0413

* cited by examiner

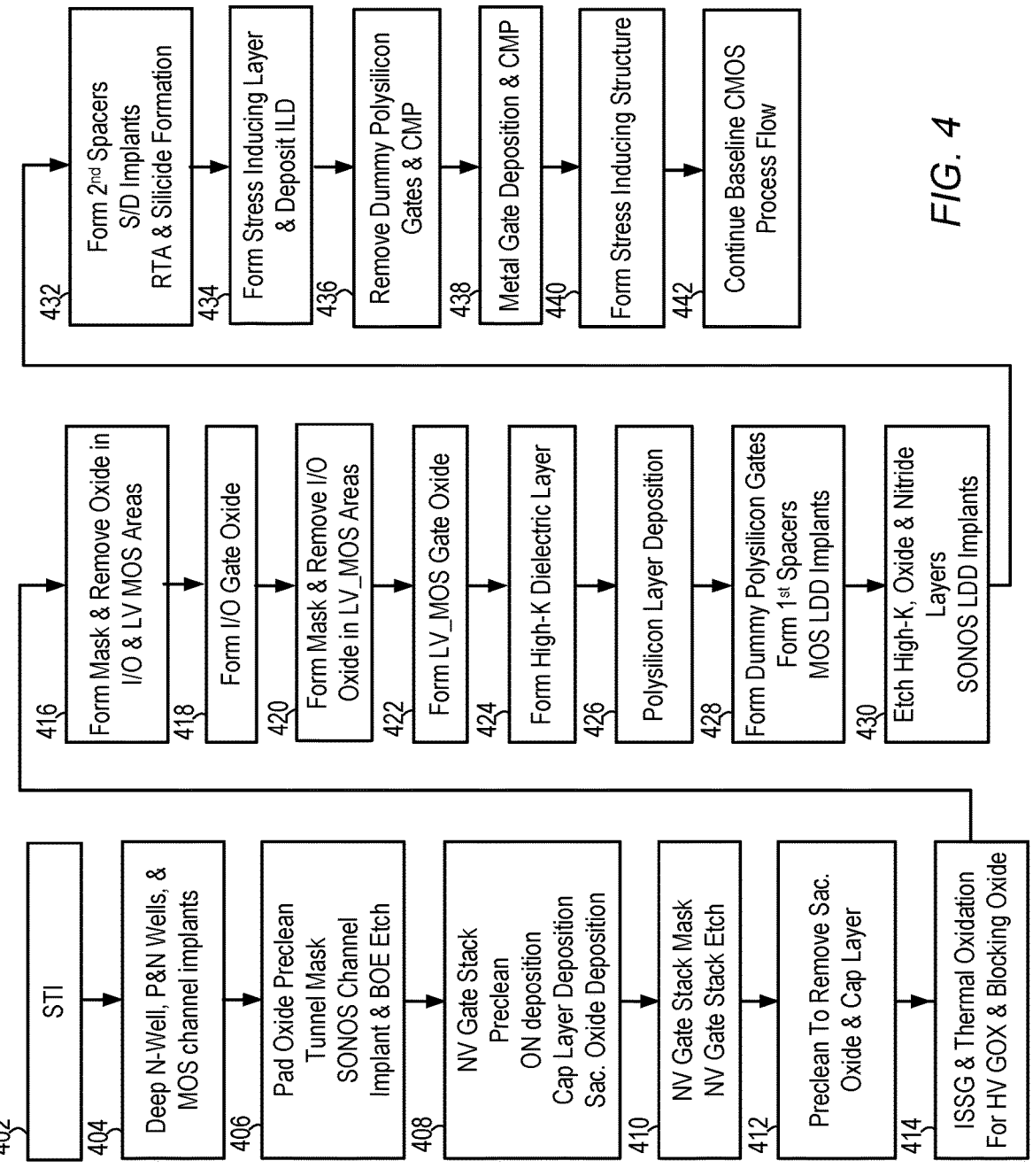

FIG. 4

402 STI

404 Deep N-Well, P&N Wells, & MOS channel implants

406 Pad Oxide Preclean
Tunnel Mask
SONOS Channel
Implant & BOE Etch

408 NV Gate Stack
Preclean
ON deposition
Cap Layer Deposition
Sac. Oxide Deposition 410 NV Gate Stack Mask
NV Gate Stack Etch 412 Preclean To Remove Sac.
Oxide & Cap Layer 414 ISSG & Thermal Oxidation
For HV GOX & Blocking Oxide 416 Form Mask & Remove Oxide in
I/O & LV MOS Areas 418 Form I/O Gate Oxide 420 Form Mask & Remove I/O
Oxide in LV_MOS Areas 422 Form LV_MOS Gate Oxide 424 Form High-K Dielectric Layer 426 Polysilicon Layer Deposition 428 Form Dummy Polysilicon Gates
Form 1st Spacers
MOS LDD Implants 430 Etch High-K, Oxide & Nitride
Layers
SONOS LDD Implants 432 Form 2nd Spacers
S/D Implants
RTA & Silicide Formation 434 Form Stress Inducing Layer
& Deposit ILD 436 Remove Dummy Polysilicon
Gates & CMP 438 Metal Gate Deposition & CMP 440 Form Stress Inducing Structure 442 Continue Baseline CMOS
Process Flow

METHOD OF INTEGRATING SONOS INTO HKMG FLOW

CROSS-REFERENCE TO RELATED APPLICATIONS

This application is claims the benefit of priority under 35 U.S.C. 119(e) to U.S. Provisional Patent Application Ser. No. 63/244,316, filed Sep. 15, 2021, which is incorporated by reference herein in its entirety.

TECHNICAL FIELD

This disclosure relates generally to semiconductor devices, and more particularly to analog and digital memory devices including embedded or integrally formed silicon-oxide-nitride-oxide-silicon (SONOS) memory transistors and high voltage transistors, and methods for fabricating the same.

BACKGROUND

Flash or non-volatile memory (NVM) devices typically include a grid or an array of storage elements or cells. In one particular embodiment, each storage cell may include at least one charge-trapping field effect transistor (FET) or memory transistor and a select transistor, and a number of peripheral circuits including input/output (I/O) transistors and logic or core transistors to read from and write to the array. The memory transistors generally include a charge-trapping or charge storage layer that trap charge between a control gate (CG) and channel to change a threshold voltage (Vt) of the transistor to store data. The select transistors to activate the memory transistor to support program and erase operations.

There are two types of charge-trapping memory transistors, a floating-gate (FG) transistor in which the charge is trapped in an electrically isolated conductive charge trapping layer, typically a polysilicon layer, is sandwiched between the CG and channel, and a silicon-oxide-nitride-oxide-silicon (SONOS) transistor in which the charge is trapped in a non-conductive, typically a silicon-nitride (SiN) layer, interposed between a lower or tunnel oxide layer and a top or blocking oxide layer, all between the CG and channel. SONOS memory transistors are considered more reliable as the non-conductive nature of the nitride charge trapping layer flash makes it more tolerant of defects in the upper or lower oxide, which could discharge the entire polysilicon charge trapping layer of the floating gate transistor.

An increasing number of applications, such as artificial intelligence (AI) and machine learning (ML), require increasing amounts of data storage and using memory devices for inferencing function, such as multiply-accumulate (MAC) operations. One way of meeting this demand is through the use of multi-level cell (MLC) in which the memory transistor is capable of storing more than a single bit of information or a single binary bit of information by storing varying amount of charge to represent different analog values, each of which results in a different threshold voltage and determines the state or analog value of data stored the MLC. For example, a MLC memory transistor capable of holding four different levels of charge, from fully programmed to partially programed, partially erased or fully erased, can yield two bits of information which can be interpreted as four distinct states: 00, 01, 10, or 11. Alternatively or additionally, it may present four distinct analog values: 0, 1, 2, or 3. Because, the memory transistor in a MLC requires a larger range of threshold voltages or a larger Vt window, it typically operates at higher gate voltages than memory transistors in single or binary level cells, meaning that the select transistor, as well as many of the transistors in the peripheral circuits, must also be high voltage (HV) transistors capable of operating at voltages of about 10 volts or more. In MLC using FG memory transistors this can be readily accomplished by increasing a thickness of a gate oxide between a gate and the channel of the HV transistors.

However, increasing a thickness of a gate oxide of the select transistor or other transistors in memory cells including SONOS memory transistors is problematic since conventional oxidation processes at high temperatures, used to form thick gate oxides can result in non-homogenous distribution of SiN charge-traps throughout a vertical thickness of the charge-trapping layer, rendering it unsuitable for MLC operations. Such integration of SONOS multi-level memory cells is particularly problematic when the memory array is included in an embedded flash device (eFlash) further including other HV, I/O, and core transistors.

Accordingly, there is a need for Flash or NVM devices including multi-level memory cells with SONOS memory transistors and HV transistors embedded or integrally formed on a single substrate, and methods for fabricating the same.

SUMMARY

A semiconductor device and methods of fabricating the same are disclosed. The semiconductor device is particularly useful in forming memory transistor and select transistor of a two-transistor (2T) multi-level memory cell (MLC) in which a gate-dielectric of the select transistor has a thickness sufficient to enable the MLC to operate at voltages up to and exceeding 10V.

Generally, the method includes forming a tunnel-dielectric for a memory transistor over a surface of a substrate, forming a nitride charge-trapping layer over the tunnel-dielectric, and forming a gate-dielectric for a field-effect transistor (FET) over the surface of the substrate. Forming the gate-dielectric can include performing a number of oxidation processes to form a thick gate-oxide (GOX) while concurrently forming a blocking-dielectric including an oxide layer over the charge-trapping layer of the memory transistor. In one embodiment, performing the oxidation processes includes performing an in-situ-steam-generation process to form the thick GOX and the oxide layer of the blocking-dielectric, followed by a thermal oxidation process to increase a thickness of the thick GOX and the oxide layer without altering a substantially uniform stoichiometric concentration of nitrogen across a thickness of the charge-trapping layer from the tunnel-dielectric to the blocking-dielectric. The thermal oxidation process can include a rapid thermal oxidation process, a wet furnace oxidation process or a dry furnace oxidation process.

The method can further include concurrently depositing a high dielectric constant (high-K) material over the thick GOX and the oxide layer of the blocking dielectric, and forming metal gates over the gate-dielectric and the blocking-dielectric to form high-K metal gate (HKMG) FET and memory transistor.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 4 is a flowchart depicting a method of integrally fabricating a NVM device including a SONOS transistor, a HV select transistor, and other input/output (IO) and core or LV_MOS transistors according to an embodiment of the present disclosure.

DETAILED DESCRIPTION

A memory cell including an embedded non-volatile memory (NVM) transistor and one or more high voltage (HV) field effect transistors (FETs) having a thick gate-oxide (GOX), and, in some embodiments, a high-K metal gate (HKMG) stack, and methods of fabricating the same are described herein with reference to figures.

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein can include both to directly electrically connect two or more components or elements and to indirectly connect through one or more intervening components.

Briefly, the present disclosure is directed to a two transistor (2T) non-volatile memory cell including a charge trapping transistor, such as a silicon-oxide-nitride-oxide-semiconductor (SONOS) non-volatile memory (NVM) transistor and a high voltage (HV) select transistor with a thick gate oxide (GOX) integrally formed on a single shared substrate using sequential thermal and in-situ-steam-generation (ISSG) oxidation processes to concurrently form a blocking oxide of the NVM transistor and the GOX. Additionally, in some embodiments the NVM transistor and select transistor further include a high K layer overlying the blocking oxide and GOX and metal gates. It has been found that such architectures enable the integration of multi-level SONOS transistors into a metal-oxide-silicon (MOS) FET process flow, without adversely impacting performance of the SONOS transistors. It has further been found that the 2T memory cell and method of forming the same are particularly useful in fabricating an inferencing device, such as an artificial neuron of a deep neuron network (DNN) system.

Figure 1A:
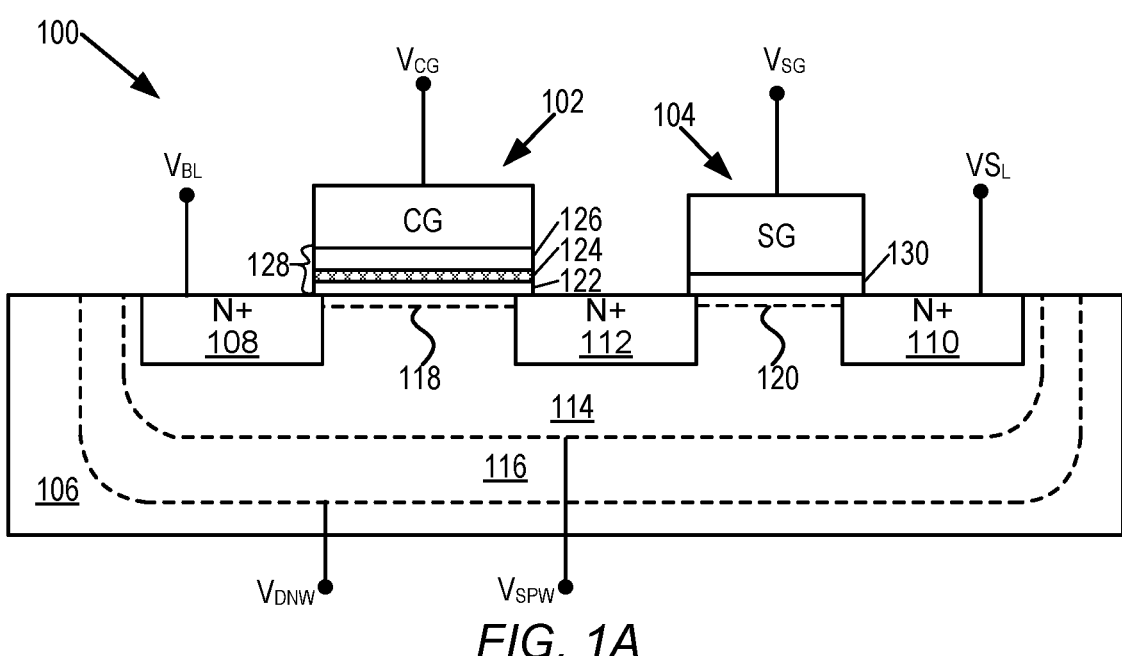
FIG. 1A is a block diagram of a cross-section of an embodiment of a two transistor (2T) non-volatile memory (NVM) cell including a silicon-oxide-nitride-oxide-semi-conductor (SONOS) transistor and a select transistor with a thick gate oxide (GOX) according to an embodiment of the present disclosure.

In a first embodiment, illustrated in FIG. 2A, the non-volatile memory (NVM) cell 100 includes a silicon-oxide-nitride-oxide-semiconductor (SONOS) type charge trapping NVM transistor 102, and a field effect or FET type select transistor 104 disposed adjacent to NVM transistor. The NVM cell 100, as illustrated in FIG. 1A, is considered having a two-transistor (2T) architecture, wherein NVM transistor 102 and FET 104 may be considered the memory transistor and the pass or select transistor, respectively throughout this patent document.

The NVM transistor 102 may be a single bit memory transistor, configured to store a binary value ("0" or "1"), or a multibit or multilevel memory transistor, capable of operating with a broad window of threshold voltages ($V_T$) of from 0V to 10V, and configured to store a multi-level analog value (e.g. 128-256 or 0-2″). Referring to FIG. 1A, the NVM transistor 102 includes a memory or control gate stack formed over a substrate 106. NVM cell 100 further includes source regions 108/110 and a drain 112 region formed directly in the substrate 106, or optionally within a shallow positive well (SPW 114) in the substrate, on either side of the NVM transistor 102. Additionally, the SPW 114 may be at least partly encapsulated within a deep negative well (DNW 116). Generally, the source region 108 and drain region 112 are connected by a first channel region 118 underneath the NVM transistor 102, and the source region 110 and drain region 112 are connected by a second channel region 120 underneath the select transistor 104, As shown in FIG. 1A, the NVM transistor 102 and the select transistor 104 share the drain region 112, referred to as internal node, disposed in-between.

The NVM transistor 102 includes an oxide tunnel dielectric layer 122, a silicon nitride (SiN) or silicon oxynitride (SiON) charge-trapping layer 124, and an oxide top or blocking layer 126, forming the ONO stack 128. In some embodiments, the charge-trapping layer 124 may include multiple silicon-nitride or silicon-oxynitride layers, which may be separated by one or more silicon-oxide layers, and traps charges injected from substrate 106 by Fowler-Nordheim (FN) tunneling. The threshold voltage ($V_T$) and drain current ($I_D$) values of the NVM transistor 102 may change at least partly due to the amount of trapped charges. The NVM transistor 102 further includes a polysilicon (poly) or a metal gate layer disposed overlying the ONO stack 128, which may serve as the control gate (CG). In operation the CG is appropriately biased by $V_{CG}$ to store or read the bit value stored by the NVM transistor 102.

The select transistor 104 is a high voltage (HV) FET transistor capable of operating at gate voltages ($V_{SG}$) of 10V or greater, and is compatible with the voltages of a multi-level NVM transistor 102. The select transistor 104 includes a metal or polysilicon select gate (SG) disposed overlying a gate dielectric or layer 130. Generally, the gate layer 130 includes a thick gate oxide layer or GOX. By thick it is meant a GOX layer having a thickness from a surface of the substrate 106 to the SG of from about 100 Angstrom (Å) to about 140 Å, substantially greater than that in conventional select transistors of NVM cells to enable high voltage operations. Optionally, as in the embodiment shown, the select transistor 104 is also formed within the SPW 114 in the DNW 116. In operation the SG is appropriately biased by $V_{SG}$ to open or close the channel 120 underneath the select transistor 104.

Figure 1B:
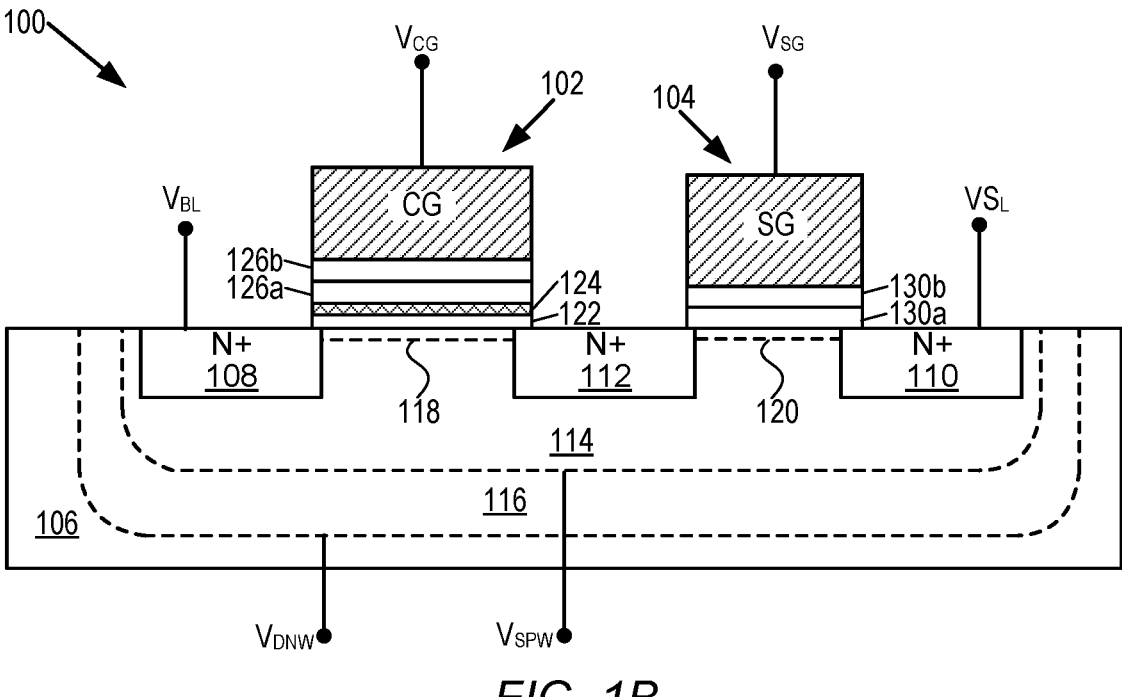
FIG. 1B is a block diagram of a cross-section of another embodiment of a 2T NVM cell including a NVM transistor and a select transistor further including high K dielectrics and metal gates according to another embodiment of the present disclosure.

In an alternative embodiment, shown in FIG. 1B, the NVM cell 100 includes an NVM transistor 102 and/or a select transistor 104 in which the blocking layer and/or the gate layer 130 includes one or more layers of a high K dielectric material. Suitable high-k dielectric materials can include, but is not limited to, hafnium oxide, zirconium oxide, hafnium silicate, hafnium oxy-nitride, hafnium zirconium oxide and lanthanum oxide. Referring to FIG. 1B in the embodiment shown the blocking layer (126 in FIG. 1A) of the NVM transistor 102 includes an oxide layer 126a and a high K dielectric layer 126b, and the gate layer (130 in FIG. 1B) of the select transistor 104 includes an oxide layer 130a and a high K dielectric layer 130b.

Optionally, as in the embodiment shown, either the CG of the NVM transistor 102, the SG of the select transistor 104, or both can include one or more layers of metal or a metal alloy. Suitable metals or alloys include, but are not limited to, aluminum, copper, titanium, tungsten and alloys thereof.

Figure 2:
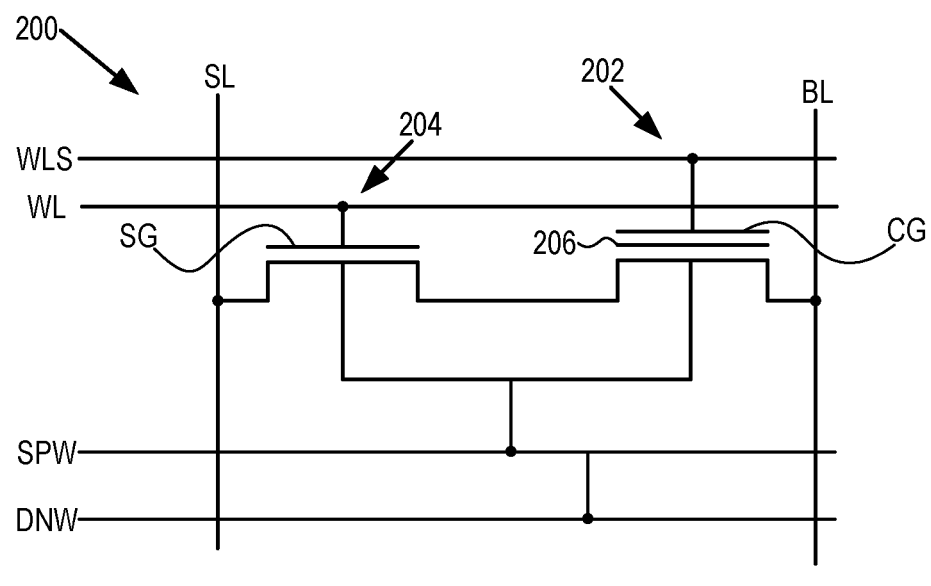
FIG. 2 is a schematic diagram illustrating an exemplary embodiment a 2T NVM cell, such as shown in FIG. 1A or 1B.

FIG. 2 is a schematic diagram illustrating an exemplary embodiment of a two-transistor (2T) memory cell 200, such as shown in FIGS. 1A and 1B, with a SONOS type NVM transistor 202 connected in series with an FET type select transistor 204. The NVM cell 200 is selected for a programming or read operation by appropriately biasing the SG of the select transistor 204 through a word line (WL) coupled to the SG. The NVM cell 200 is programmed (i.e., a bit value greater than "1") when the CG is appropriately biased by applying to a SONOS word line (WLS) coupled to the CG a positive pulse with respect to the substrate or shallow well (SPW) in which the NVM transistor 202 is formed that causes electrons to be injected from an inversion layer or channel underlying the NVM transistor into the charge-trapping layer 206 by FN tunneling. The charge trapped in the charge-trapping layer 206 results in an electron depletion between a drain of the NVM transistor 202 coupled through the select transistor 204 to a source line (SL) and a source of the NVM transistor coupled to a bitline (BL), raising the threshold voltage ($V_T$) necessary to turn on the SONOS based NVM transistor, putting the device in a "programmed" state. As noted above, where the NVM transistor 202 is a multibit or multilevel memory transistor, capable of operating with a broad window of threshold voltages ($V_T$) of from 0V to 10V, the device can be programmed to store from one to $2^n$ bit values.

The NVM cell 200 is erased by applying an opposite voltage or a negative pulse on the CG, with respect to substrate or well causing FN tunneling of holes from the accumulated channel into the ONO stack. Programmed and erased threshold voltages are called "Vtp" and "Vte" respectively.

Figure 3:
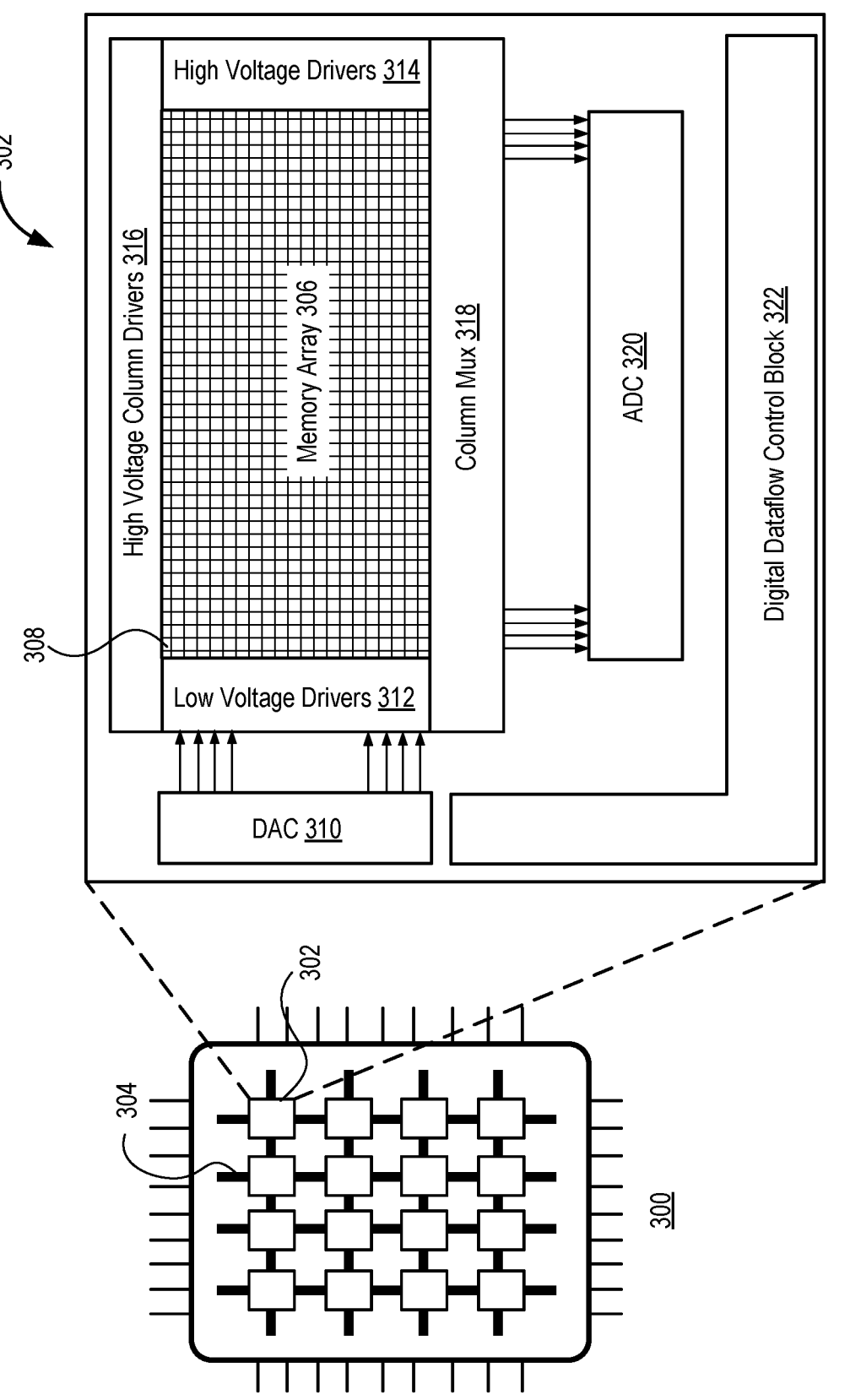
FIG. 3 is a representative block diagram illustrating a neural network of artificial neurons for which embodiments of a multi-level 2T memory cell including a SONOS are particularly useful.

FIG. 3 is a representative block diagram illustrating a neural network 300 of artificial neurons in a deep neuron network (DNN) system (not shown) for which embodiments of the above described 2T memory cell and methods of forming or fabricating the same are particularly useful.

Referring to FIG. 3, neural network 300 generally includes multiple artificial neurons or NVM devices 302 coupled to one another via a bus system 304. Each NVM device 302 includes a memory array 306 of 2T NVM cells 308, each with a SONOS type NVM transistor and a FET type select transistor (not shown) integrally formed on a single substrate in accordance with an embodiment of the present disclosure. In one embodiment, the SONOS NVM transistors are multi-bit or multi-level transistors having the ability to store analog values of weights locally and process each non-volatile memory element in parallel. Thus, each NVM cell 308 may have multiple levels (e.g. 4 bit-8 bit) instead of binary levels (1 bit), and each $I_D/V_T$, level may represent a multi-bit weight value.

Referring to the left hand side of FIG. 3, each NVM device 302 may include in addition to the memory array 306, a digital-to-analog-converter (DAC 310) to receive digital inputs from the bus 304 that are then be converted to analog signals and coupled to the memory array 306 through low voltage drivers 312 and/or high voltage drivers 314. In one embodiment, the low voltage drivers 312 generate control signals to control SGs of multi-level NVM cells via the WLSs, and high voltage drivers 314 control CGs of multi-level NVM cells via the WLs. The NVM device 302 further includes high voltage column drivers 316 to generate control signals to the BLs of the NVM cells 308, a column multi-plexer (MUX 318) select an NVM cell for a program or read operation, and analog-to-digital-converters (ADCs 320) to convert analog signals from the MUX to digital signals to be outputted to another or other NVM device(s), or from the neural network 300. Generally, as in the embodiment shown, each NVM device 302 further includes programmable command and control circuitry including a digital dataflow control block 322, which may be configured and operable to direct data flow traffic within the NVM device.

It will be understood that each NVM device 302 further includes in addition to the SONOS transistor and select transistor described above, a large number of other HV and low voltage (LV) input/output (IO) and logic or core transistors in the converters, drivers, control block and other peripheral circuits. It will further be appreciated that it is advantageous to integrally form or fabrication all or a substantial number of these transistors on a single substrate in a single process flow, without adversely impacting performance of the SONOS transistors.

FIG. 4 is a flowchart depicting one such method of integrally fabricating a NVM device including a SONOS transistor, a HV select transistor, and other HV and LV input/output, and logic or core transistors according to an exemplary embodiment of the present disclosure.

Figures 5A, 5B:
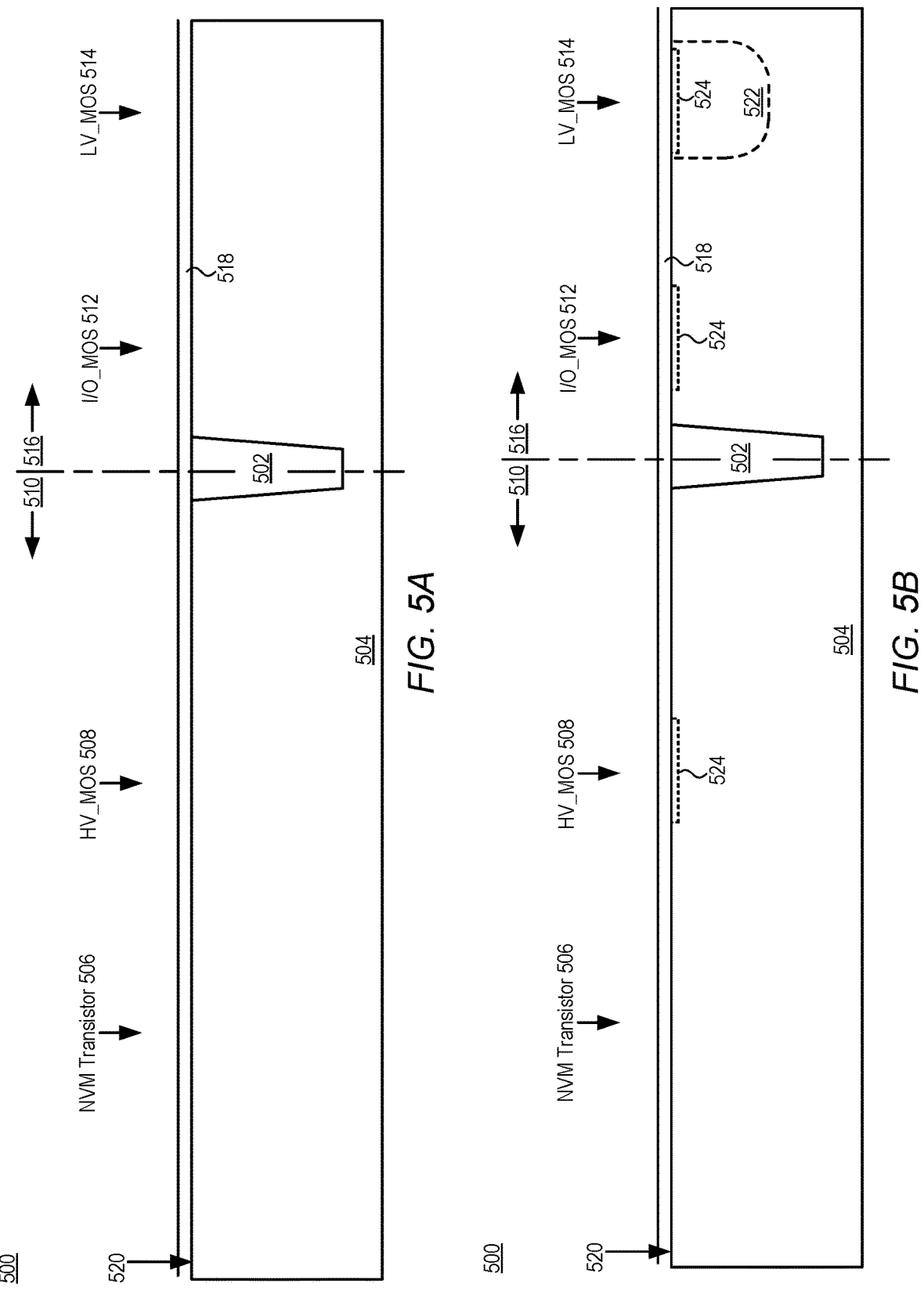
FIGS. 5A through 5V illustrate cross-sections of a portion of a NVM device fabricated according to the method of FIG. 4 at various times or steps in the manufacturing process.
Figures 5C, 5D:
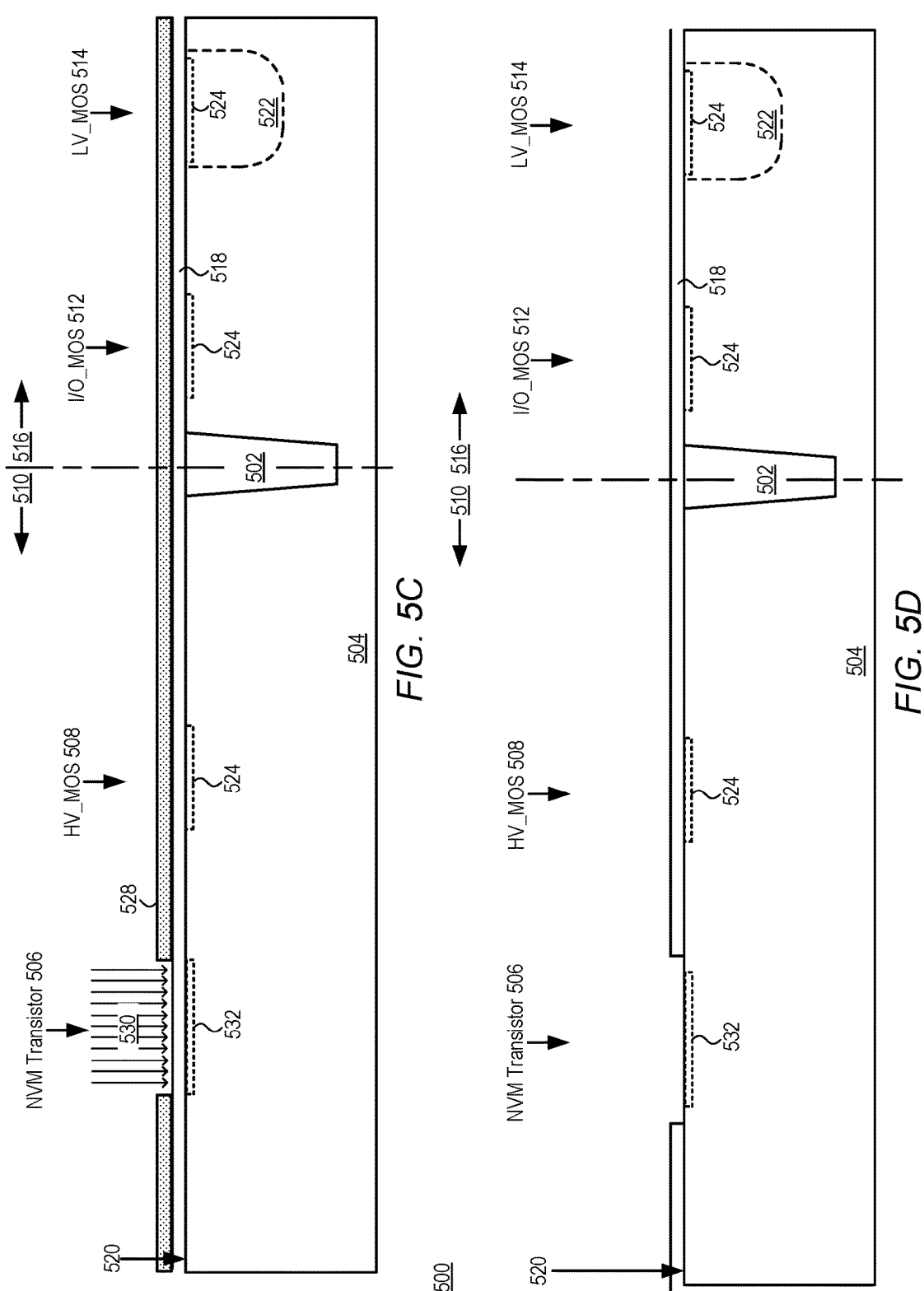
Figures 5E, 5F:
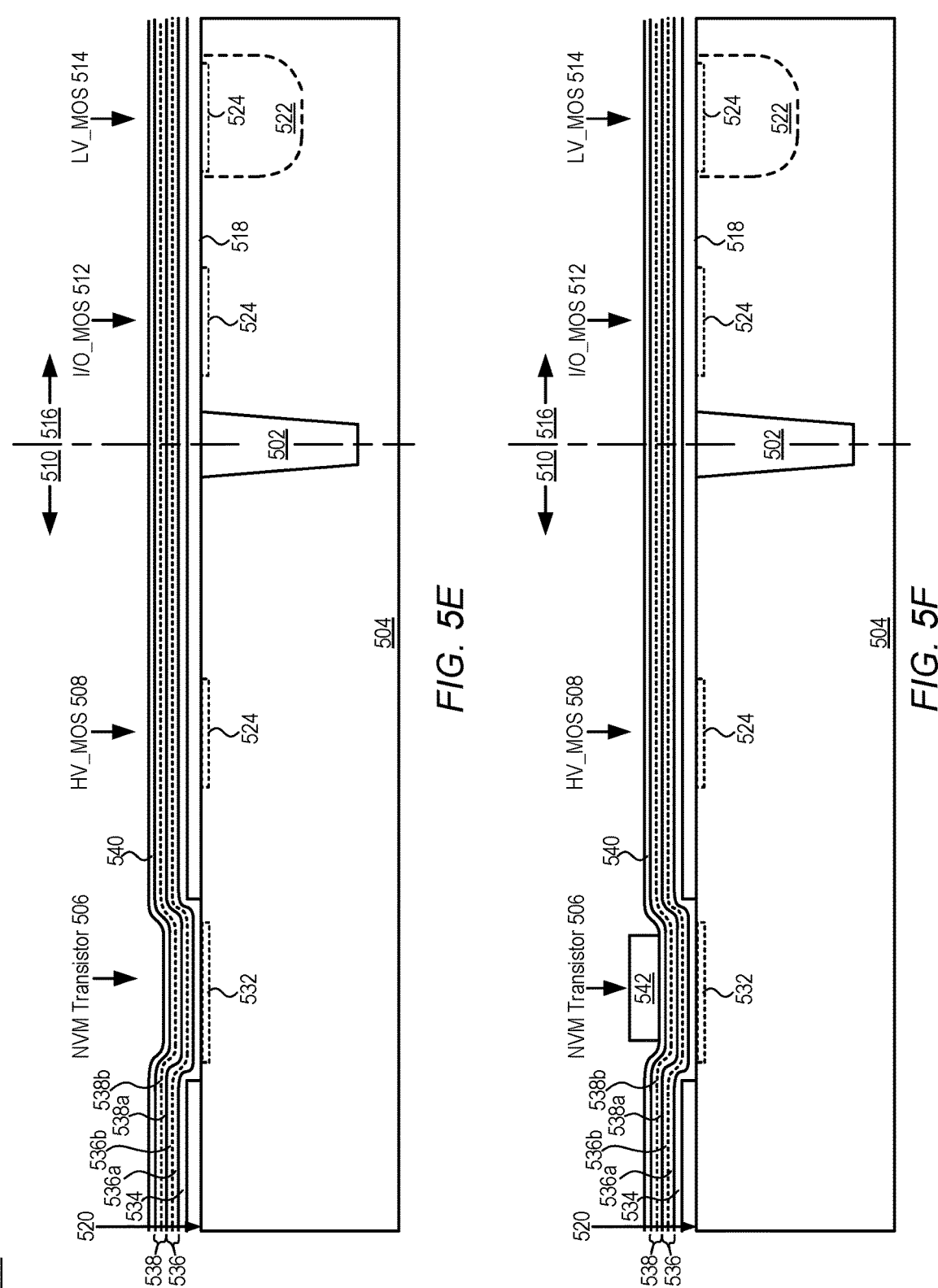
Figures 5G, 5H:
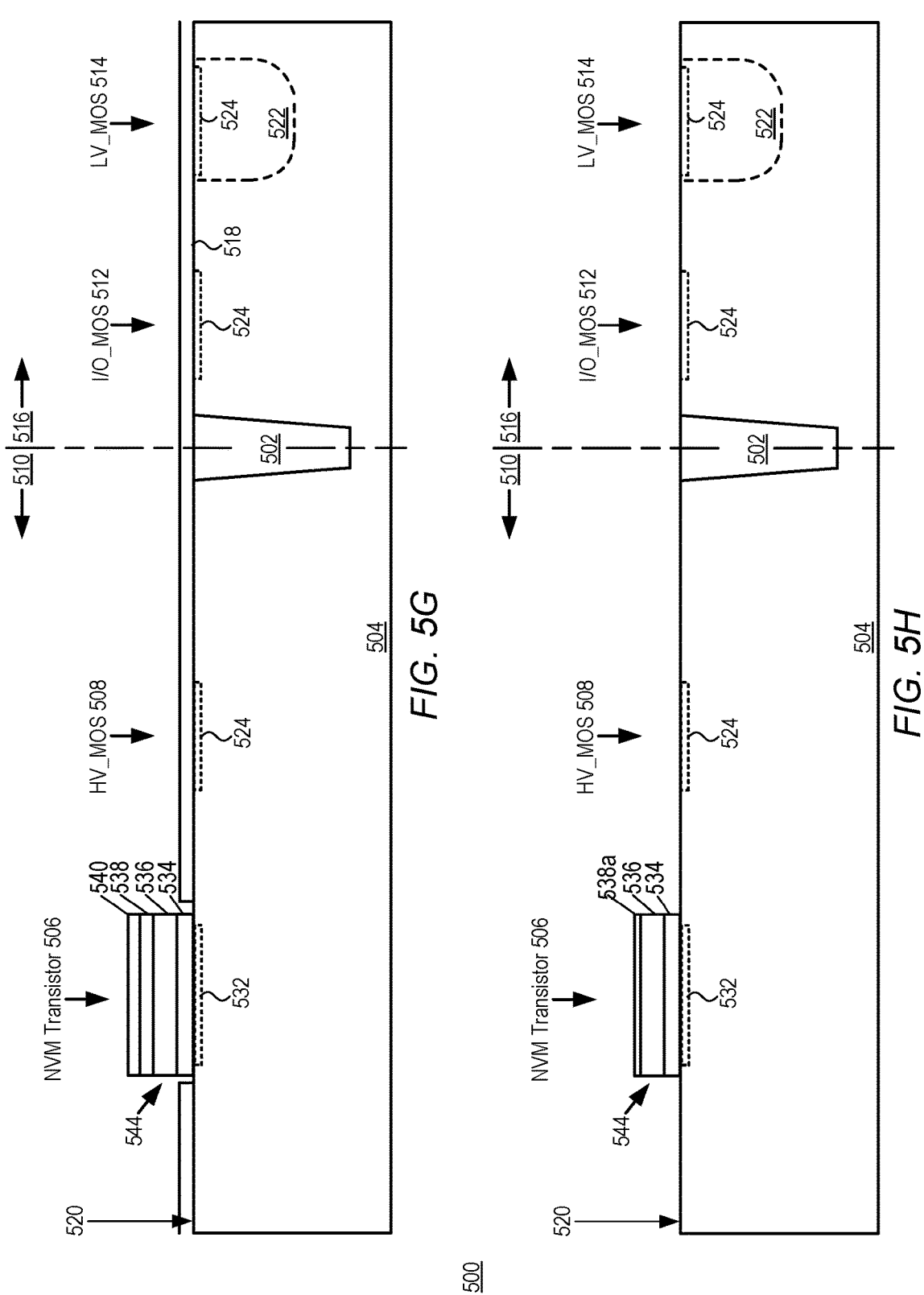
Figures 5I, 5J:
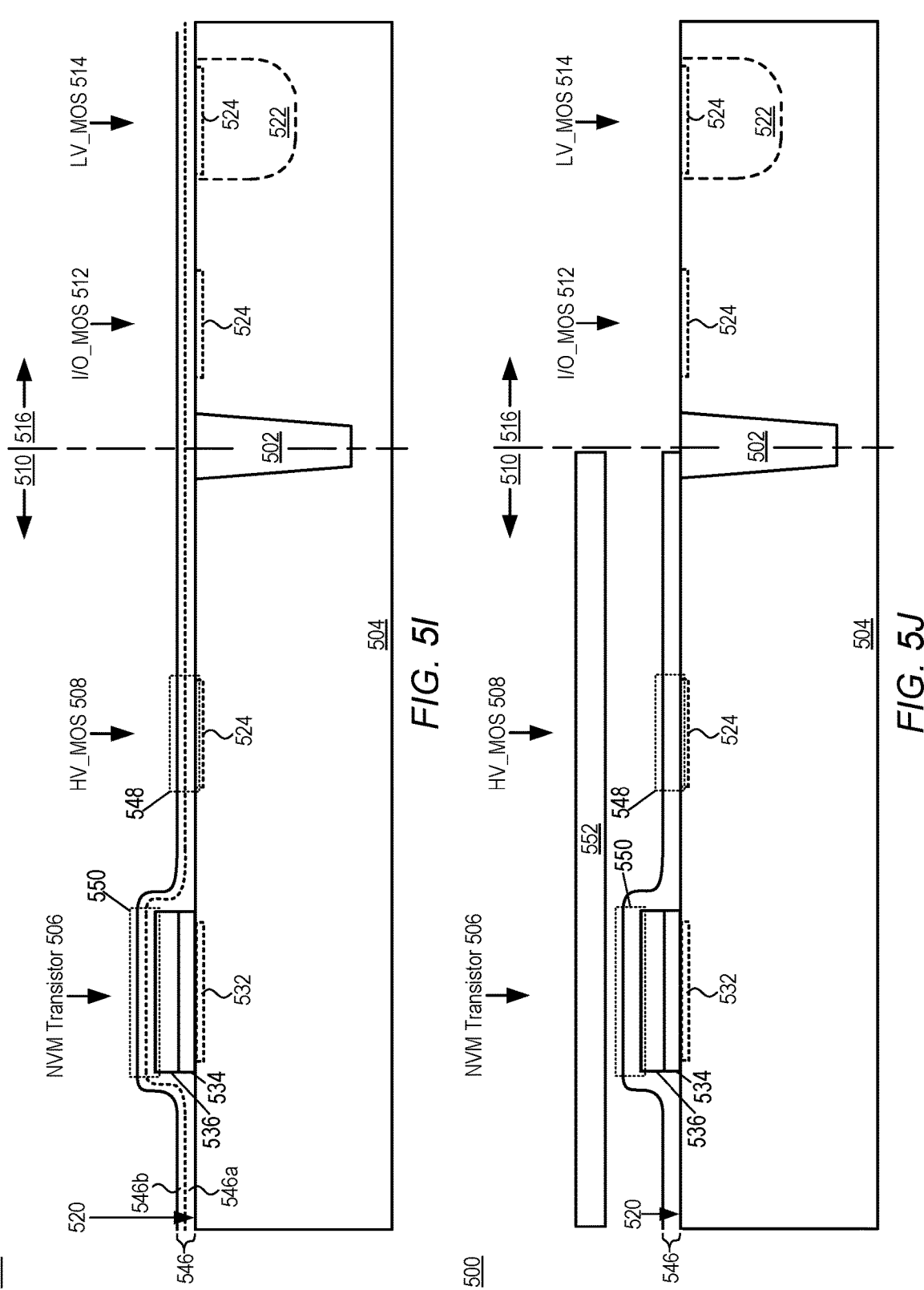
Figures 5K, 5L:
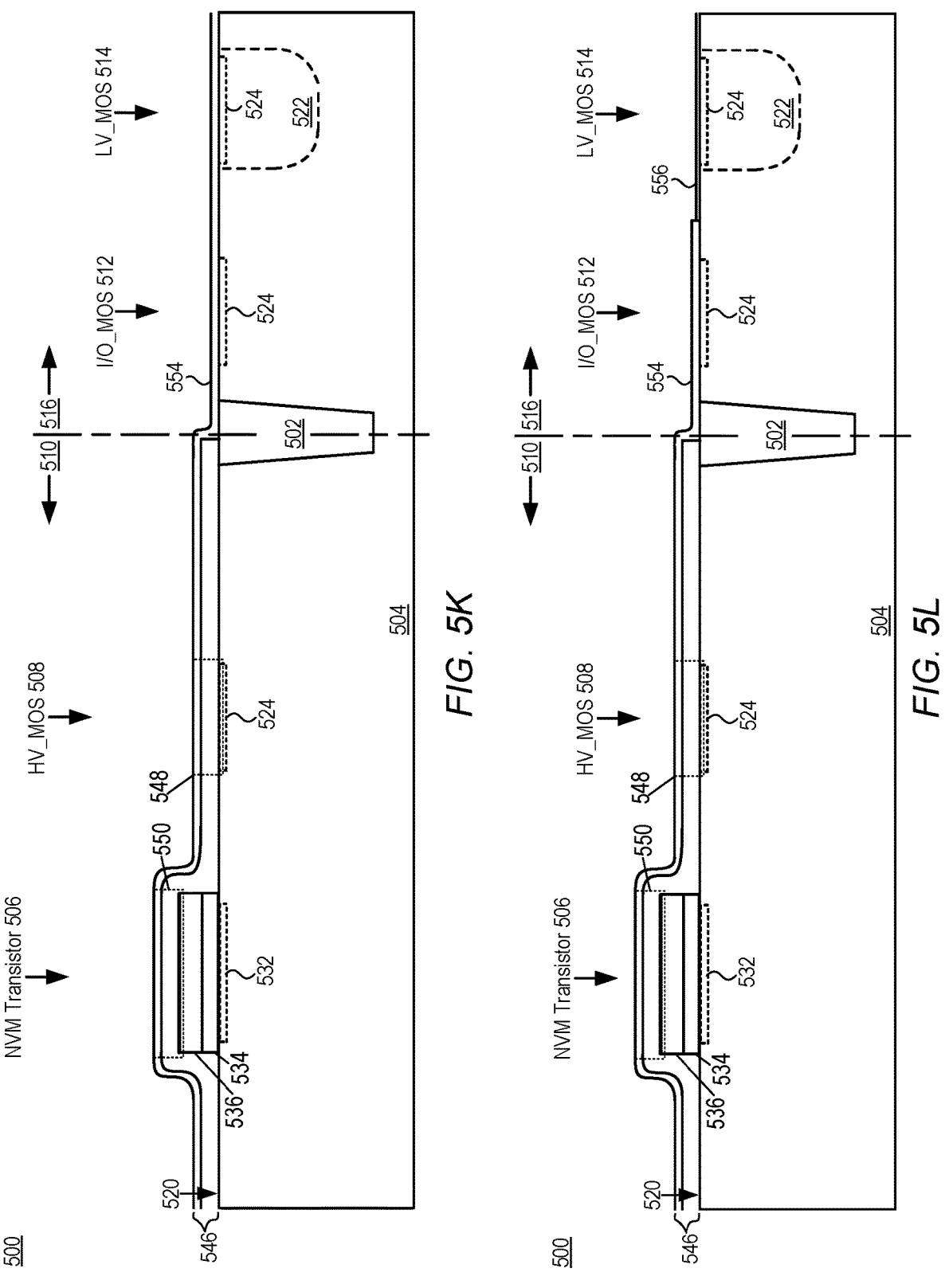
Figures 5M, 5N:
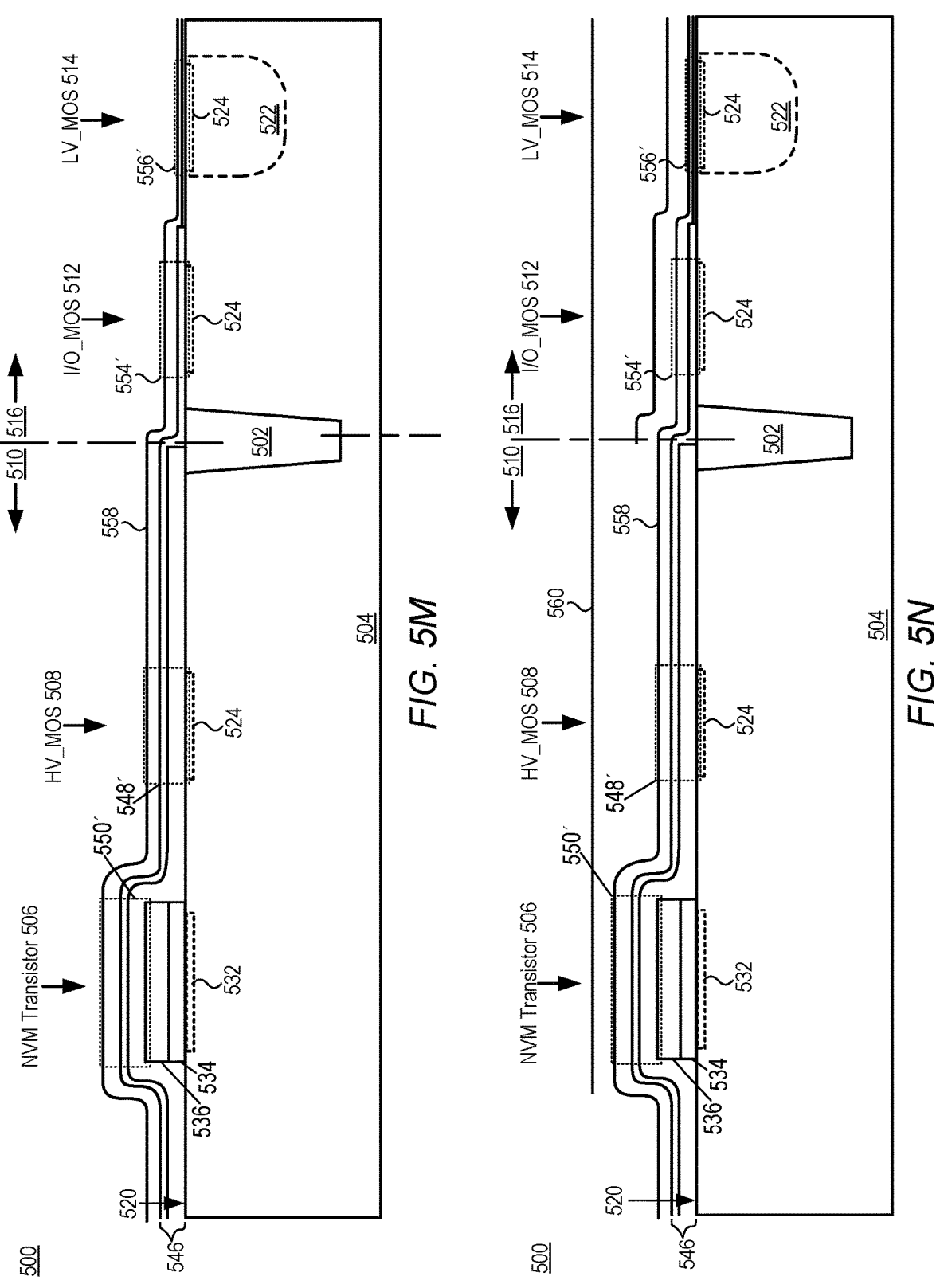
Figures 5O, 5P:
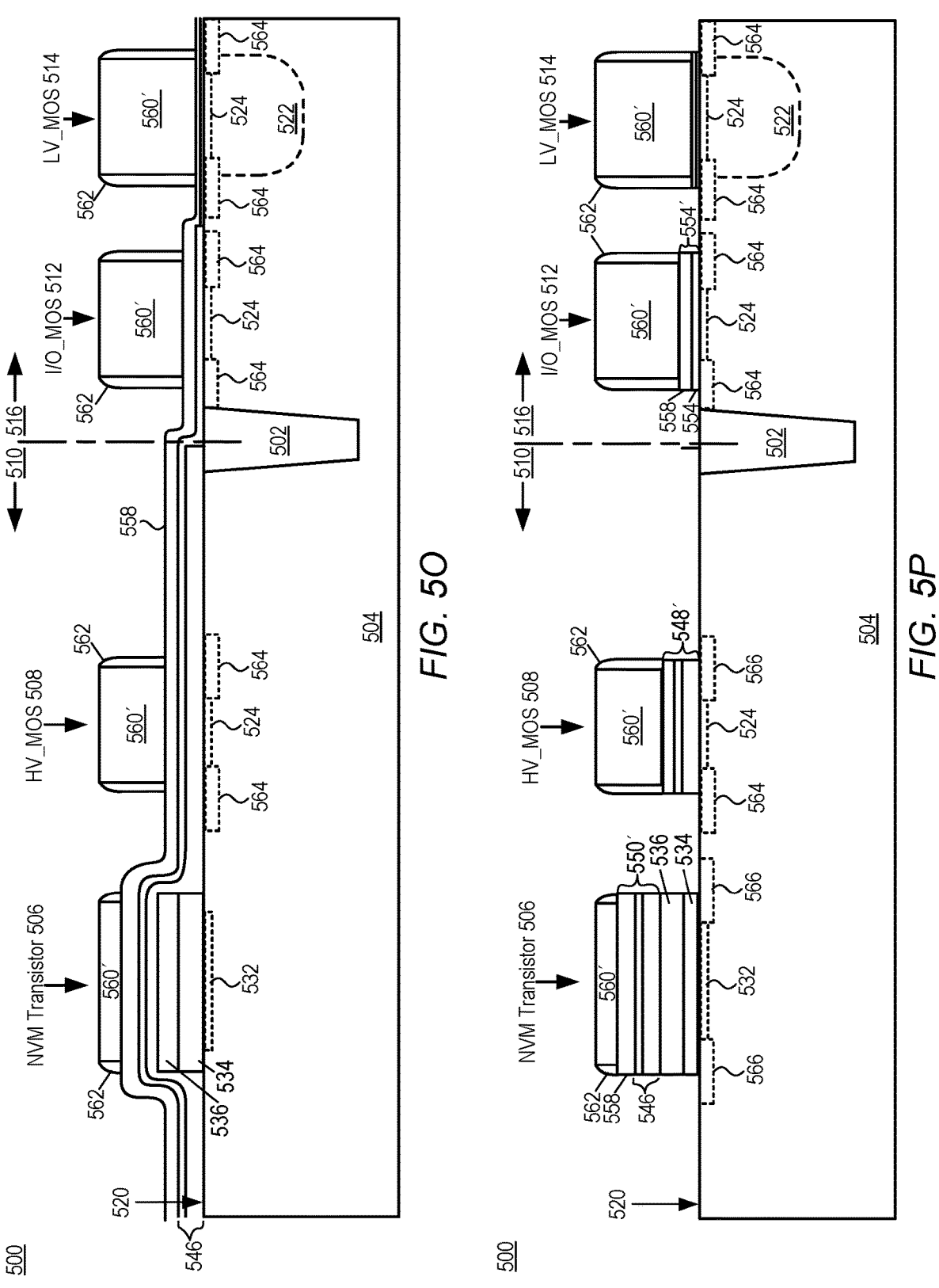
Figure 5Q:
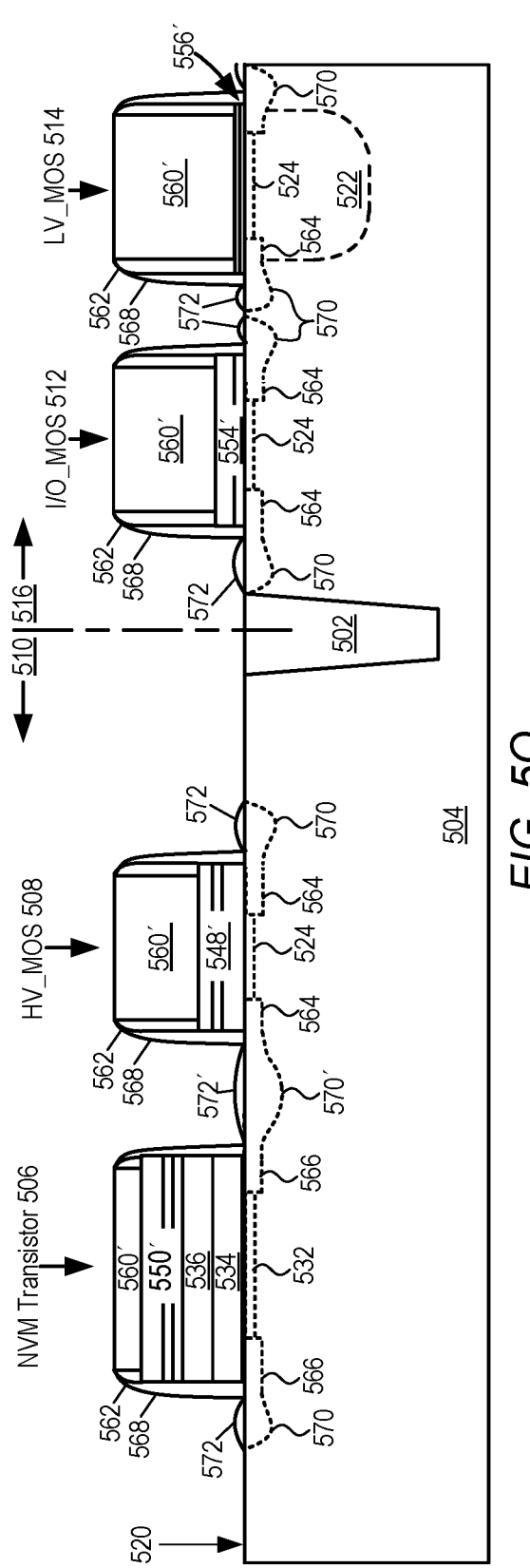
Figure 5R:
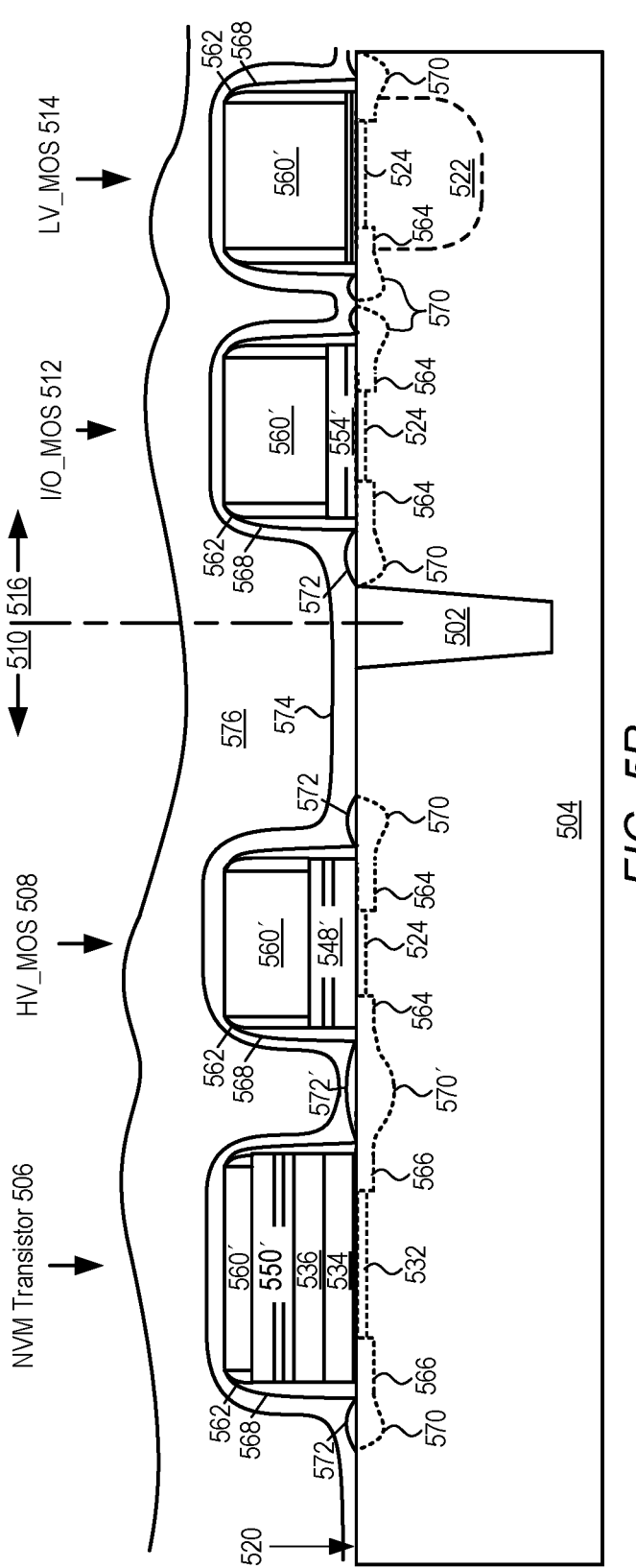
Figure 5S:
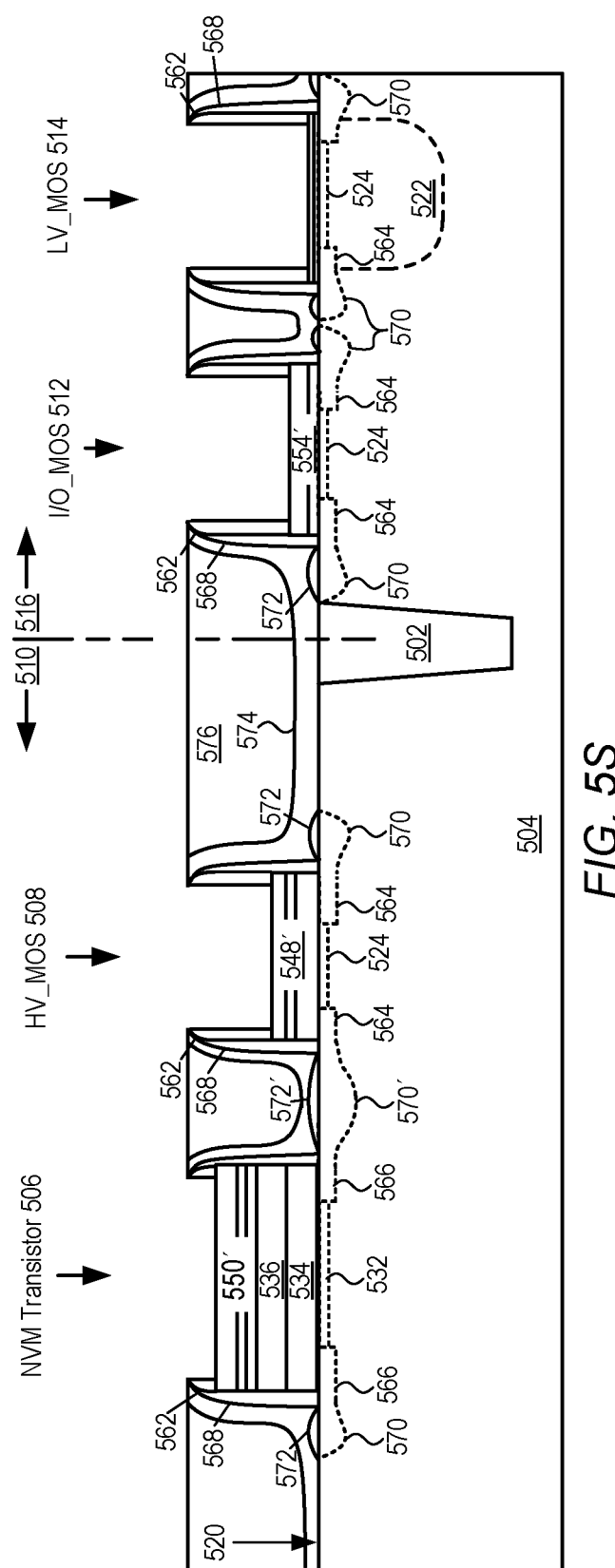
Figure 5T:
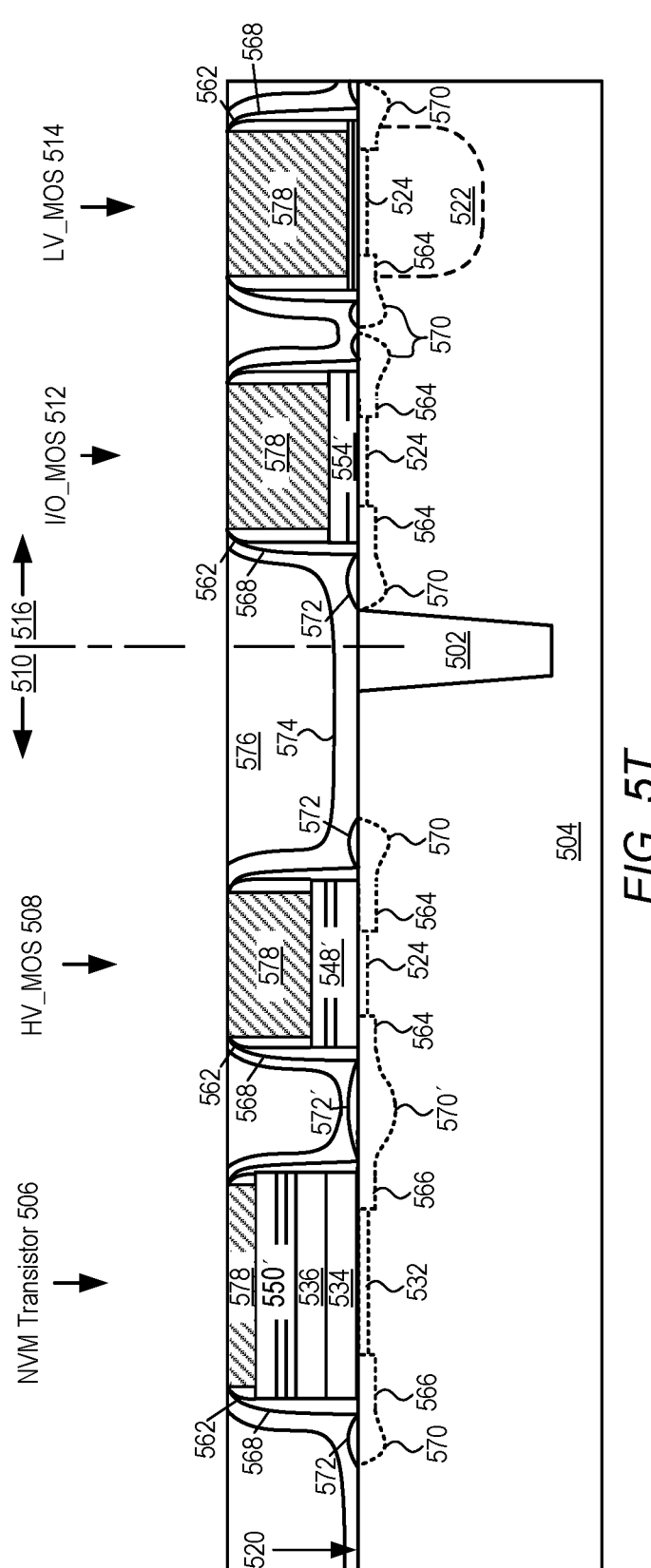
Figure 5U:
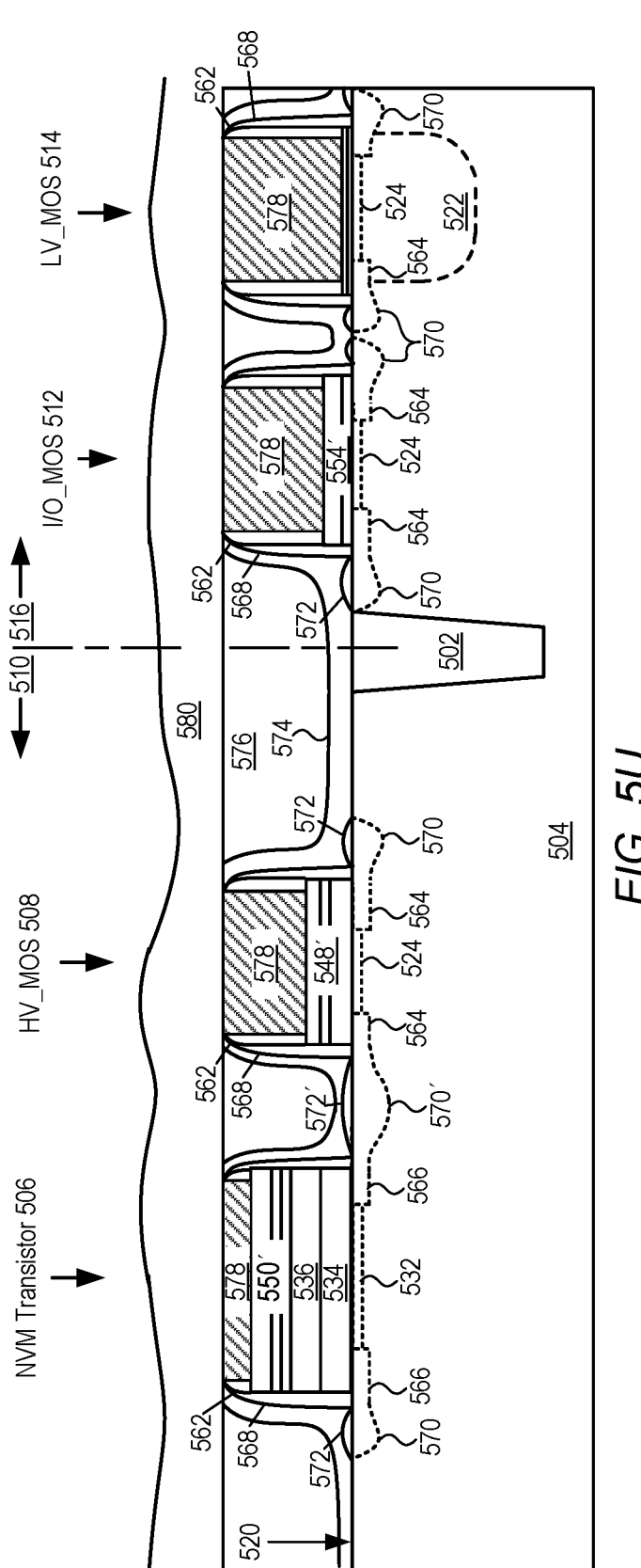
Figure 5V:
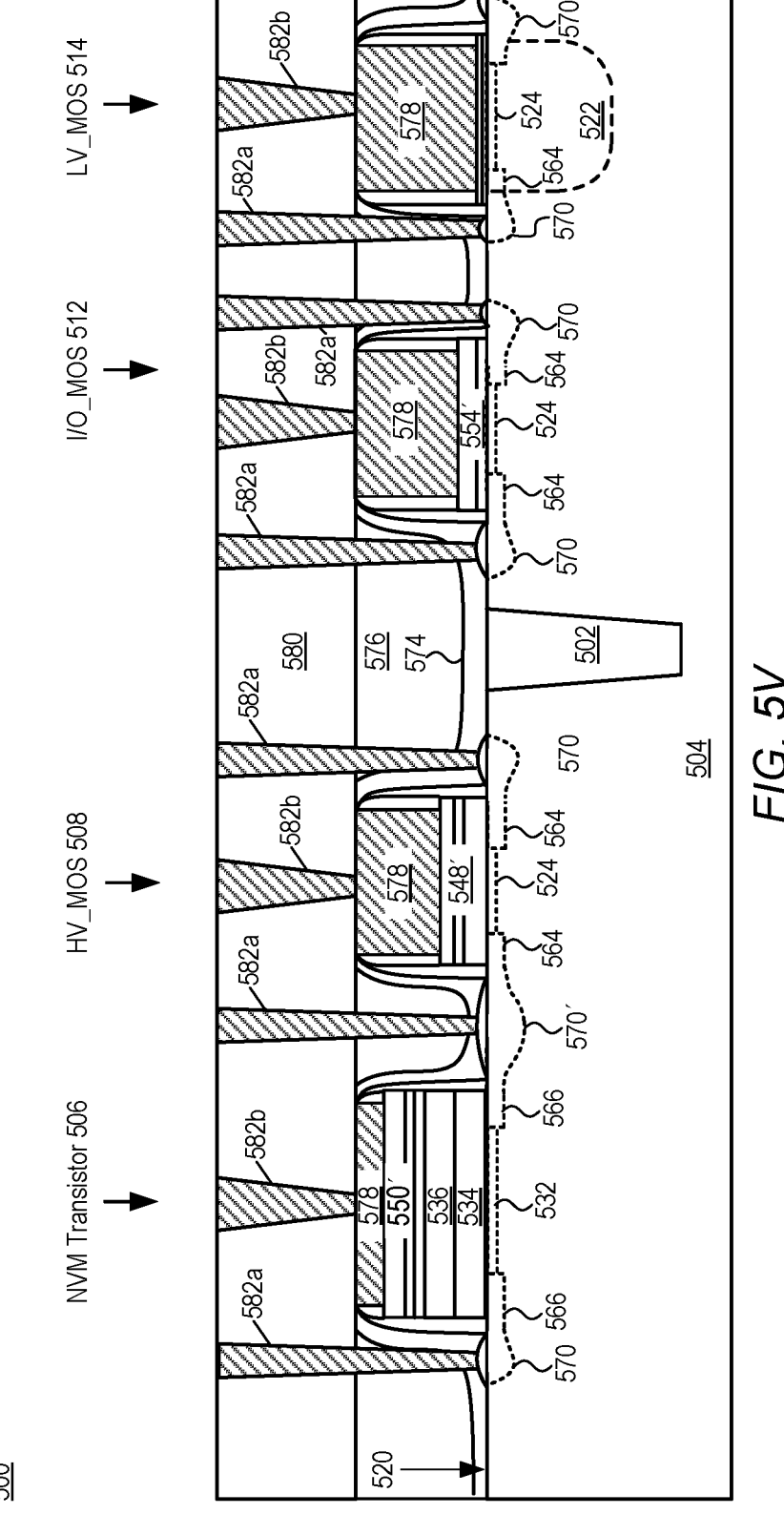

FIGS. 5A through 5V illustrate cross-sections of a portion of a NVM device 500 fabricated according to the method of FIG. 4 at various times or steps in the manufacturing process.

Referring to FIG. 4 and FIG. 5A, the process begins with forming a number of isolation structures or shallow trench isolation (STI) 502 in a wafer or substrate 504 (step 402). The isolation structures 502 isolate the NVM transistor 506 and a select transistor or HV_MOS transistor 508 of a two-transistor (2T) memory cell, being formed in a first region 510 of the substrate 504 from one or more MOS transistors including in input/output transistor or I/O_MOS transistor 512, and a core or LV_MOS transistor 514, being formed in a second region 516. One having ordinary skill in the art would understand that isolation structures 502 may be formed anywhere in substrate 504 as required, and shall not be limited to the ones shown in the figures. Optionally, in some embodiments additional isolation structures 502 may be incorporated to isolate the memory cell being formed from memory cells formed in adjoining areas (not shown) of the substrate 504, and/or to isolate the I/O_MOS transistor 512 and LV_MOS transistor 514 from one another. Generally, the isolation structures 502 include a dielectric material, such as oxide or nitride, and may be formed by any conventional technique, including but not limited to STI or local oxidation of silicon (LOCOS). The substrate 504 may be a bulk substrate composed of any single crystal material suitable for semiconductor device fabrication, or may include a top epitaxial layer of a suitable material formed on a substrate. In one embodiment, suitable materials for substrate 504 include, but are not limited to, silicon, germanium, silicon-germanium or a Group III-V compound semiconductor material.

Optionally in some embodiments, as best shown in FIG. 5A, pad oxide 518 may be formed over a surface 520 of the substrate 504 in both the first region 510 and the second region 516. In one embodiment, pad oxide 518 may be silicon dioxide ($SiO_2$) having a thickness of from about 40 nanometers (nm) to about 50 nm or other thicknesses and may be grown by a thermal oxidation process or in-situ steam generation (ISSG) process, or other oxidation or deposition processes known in the art. It will be the understanding that pad oxide 518 may not be necessary, or formed in some embodiments.

Referring to FIG. 4 and FIG. 5B, dopants are then implanted into substrate 504 through pad oxide 518 (if present) to form wells in which the NVM transistor(s) and/or the MOS transistors may be formed, and channels for the MOS transistors (step 404). The dopants implanted may be of any type and concentration, and may be implanted at any energy, including energies necessary to form wells or deep wells for the NVM transistors and/or the MOS transistors, and to form channels for the MOS transistors. In one particular embodiment, illustrated in FIG. 5B as an example, dopants of an appropriate ion species are implanted to form a deep N-well 522 in the second region 516 in which a P-type or P-channel transistor LV_MOS transistor 514 may be formed. In other embodiments, additional wells or deep wells may also be formed for the NVM transistor 506 and/or HV_MOS transistor 508, and/or I/O_MOS transistor 512. It is further appreciated that the wells, such as deep N-well 522, may be formed by depositing and patterning a mask layer, such as a photoresist layer above surface 520 of substrate 504, and implanting an appropriate ion species at an appropriate energy to an appropriate concentration. It will be understood that there may be both P-type and/or N-type transistors in first region 510 and/or second region 516. The locations, quantity, and types of NVM transistor(s) 506, HV_MOS transistor 508, I/O_MOS transistor 512, and LV_MOS transistor 514 illustrated in FIG. 5B and other figures are merely for illustrative purposes, and should not be construed as limitations.

In one embodiment, channels 524 for one or more of the HV, I/O, and LV_MOS transistors 508, 512, 514, may be formed in the substrate 504. It will be the understanding that channels 524 of HV, I/O, and LV_MOS transistors 508, 512,

514, may or may not be formed concurrently. As with the well implant(s), the channels 524 may be formed by depositing and patterning a mask layer, such as a photoresist layer above the surface 520 of substrate 504, and implanting an appropriate ion species at an appropriate energy to an appropriate concentration. In one embodiment, for example, $BF_2$ may be implanted at an energy of from about 40 kilo-electron volts (keV), to about 400 keV, and at a dose of from about 4e12 $cm^{-2}$ to about 4e14 $cm^{-2}$ to form an N-channel or N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 524, in all three of the MOS transistors 508, 512, 514, at the same time, or at separate times using standard lithographic techniques, including a patterned photoresist layer to mask one or more of the channels 524 for the MOS transistors 508, 512, 514.

Next, referring to FIG. 4 and FIGS. 5C and 5D, a patterned tunnel mask 528 is formed on or overlying pad oxide 518 layer, ions (represented by arrows 530) of an appropriate type, energy, and concentration are implanted through a window or opening in tunnel mask 528 to form a channel 532 for NVM transistor 506, as shown in FIG. 5C, and the tunnel mask 528 and at least a portion of the pad oxide 518 in the region in which the NVM transistor 506 is to be formed removed (step 406). The tunnel mask 528 may include a photoresist layer, or a hard mask formed from a patterned nitride or silicon-nitride layer. In embodiments in which multiple NVM transistors 506 are present in first region 510, multiple channels 532 may be formed concurrently, individually, or in groups.

In one embodiment, the channel 532 for the NVM transistor 506 may be a deep indium doped channel implanted with indium (In) at an energy of from about 50 kilo-electron volts (keV) to about 500 keV, and a dose of from about 5e11 $cm^{-2}$ to about 4e13 $cm^{-2}$ to form an N-channel NVM transistor 506. Implanting indium to form the channel 532 of NVM transistor 506 improves the threshold voltage ($V_T$) uniformity of the finished NVM transistor from a sigma of $V_T$ from about 450 millivolts (mV) to about 70-80 mV. Optionally, the channel 532 can include a shallow doped channel implanted with arsenic at an energy about 50 keV and a dose of from about 5e11 $cm^{-2}$ to about 4e13 $cm^{-2}$. Alternatively, $BF_2$ may be implanted to form an N-channel NVM transistor 506, or arsenic or phosphorous implanted to form a P-channel NVM transistor. In one embodiment, the channel 532 for NVM transistor 506 may also be formed concurrently with channels 524 of the MOS transistors 508, 512, 514. In some embodiments, channel(s) 532 of N-channel NVM transistor(s) and P-channel NVM transistor(s) may be formed concurrently, or separately.

In some embodiments, as illustrated in FIG. 5D, pad oxide 518 in the window or opening in the tunnel mask 528, may be removed, for example in a wet clean process using a 40:1 buffered oxide etch (BOE) containing a surfactant. Alternatively, the wet clean process can be performed using a 50:1 BOE wet etch, a 50:1 hydrofluoric (HF) wet etch, a pad etch, or any other similar hydrofluoric-based wet etching chemistry. Subsequently or concurrently, tunnel mask 528 includes photoresist material may be ashed or stripped using oxygen plasma. Alternatively, a hard tunnel mask 528, where used, may be removed using a wet or dry etch process known in the art.

Referring to FIG. 4 and FIG. 5E, the surface 520 of substrate 504 is cleaned or pre-cleaned in at least the first region 510, and a number of dielectric layers including a lower oxide and nitride (ON) layers of an NV gate stack sequentially formed or deposited (step 408). As shown in FIG. 5E the number of dielectric layers includes a tunnel-dielectric 534 formed or deposited over the surface 520 of the substrate 504 and the pad oxide 518 where included, a charge-trapping-layer 536 or CTL on the tunnel-dielectric, a nitride cap layer 538 deposited on the charge-trapping-layer, and a sacrificial oxide 540 deposited on the nitride cap layer. The preclean may be a wet or dry process. In one embodiment, it may be a wet process using HF or standard cleans (SC1) and (SC2), and is highly selective to the material of substrate 504. In one embodiment, SC1 is typically performed using a 4:1:5 solution of ammonium hydroxide ($NH_4OH$), hydrogen peroxide ($H_2O_2$) and water ($H_2O$) at 30° C. to 80° C. for about 40 minutes. In another embodiment, SC2 is a short immersion in a 4:1:10 solution of HCl, $H_2O_2$ and $H_2O$ at about 30° C. to 80° C.

The tunnel-dielectric 534 may be any material and have any thickness suitable to allow charge carriers to tunnel into an overlying charge-trapping layer under an applied gate bias while maintaining a suitable barrier to leakage when NVM transistor 506 is unbiased. Generally, tunnel-dielectric 534 may include silicon dioxide, silicon oxy-nitride or a combination thereof and may be grown by a thermal oxidation process, using ISSG or radical oxidation.

In one embodiment a silicon dioxide tunnel-dielectric 534 may be thermally grown in a thermal oxidation process. For example, a layer of silicon dioxide may be grown utilizing dry oxidation at 700° C.-800° C. in an oxygen containing gas or atmosphere, such as oxygen ($O_2$) gas. The thermal oxidation process is carried out for a duration approximately in the range of 50 to 450 minutes to effect growth of a tunnel-dielectric 534 having a relatively uniform thickness of from about 1.0 nanometers (nm) to about 3.0 nm by oxidation and consumption of the exposed surface of substrate. It will be understood that such a range is merely illustrative and is not meant to be limiting.

In another embodiment, a silicon dioxide tunnel-dielectric 534 may be grown in a radical oxidation process involving flowing hydrogen ($H_2$) and oxygen ($O_2$) gas into a processing chamber at a ratio to one another of approximately 4:1 without an ignition event, such as forming of a plasma, which would otherwise typically be used to pyrolyze the H2 and O2 to form steam. Instead, the $H_2$ and $O_2$ are permitted to react at a temperature approximately in the range of about 900° C. to about 1100° C. at a pressure approximately in the range of about 0.5 Torr to about 40 Torr to form radicals, such as, an OH radical, an $HO_2$ radical or an O diradical, at the surface of substrate. The radical oxidation process is carried out for a duration approximately in the approximate range of about 4 to about 40 minutes to effect growth of a tunnel-dielectric 534 having a thickness of from about 1.0 nanometers (nm) to about 4.0 nm by oxidation and consumption of the exposed surface of substrate. It will be understood that in FIG. 5E and subsequent figures the thickness of tunnel-dielectric 534 may be exaggerated for the purposes of clarity. In other embodiment, tunnel-dielectric 534 grown in a radical oxidation process may be both denser and composed of substantially fewer hydrogen atoms per cm.sup.3 than a tunnel-dielectric formed by wet oxidation techniques, even at a reduced thickness. In certain embodiments, the radical oxidation process is carried out in a batch-processing chamber or furnace capable of processing multiple substrates to provide a high quality tunnel-dielectric 534 without impacting the throughput (substrates/hr.) requirements that a fabrication facility may require.

In still another embodiment, tunnel-dielectric 534 is deposited by chemical vapor deposition (CVD) or atomic layer deposition (ALD) and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel-dielectric 534 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 5E, the charge-trapping layer 536 is formed on or overlying the tunnel-dielectric 534. Generally, the charge-trapping-layer 536 may be a multi-layer or bi-layer charge-trapping layer comprising multiple layers including at least a bottom or first charge-trapping layer 536a which is physically closer to the tunnel-dielectric 534, and a top or second charge-trapping layer 536b that is oxygen-lean relative to the first charge-trapping layer, and comprises a majority of a charge traps distributed in multi-layer charge-trapping-layer 536.

The first charge-trapping layer 536a of multi-layer charge-trapping layer 536 may include a silicon nitride ($Si_3N_4$), silicon-rich silicon nitride or a silicon oxy-nitride (SiOxNy (HO)) layer. For example, the first charge-trapping layer 536a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 536b of the multi-layer charge-trapping layer 536 is then formed, either directly or indirectly, over the first charge-trapping layer 536a. In one embodiment, the second charge-trapping layer 536b may include a silicon nitride and silicon oxy-nitride layer having a stoichiometric ratio of oxygen, nitrogen and/or silicon that is different from that of the first charge-trapping layer 536a. The second charge-trapping layer 536b may include a silicon oxynitride layer having a thickness of between about 4.0 nm and about 8.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 536a and 536b may be identical or approximately equal to one another.

In another embodiment, there may be a thin dielectric and/or thin oxide layer formed between the first and second charge-trapping layers 536a and 536b, making the multi-layer charge trapping layer 536 an NON layer. In some embodiments, the multi-layer charge-trapping layer 536 is a split charge-trapping layer, further including a thin, middle oxide layer separating the first (lower) and second (upper) charge-trapping layers 536a and 536b. The middle oxide layer substantially reduces the probability of electron charge that accumulates at the boundaries of the second charge-trapping layer 536b during programming from tunneling into the first charge-trapping layer 536a, resulting in lower leakage current than for the conventional memory devices. In one embodiment, the middle oxide layer may be formed by oxidizing to a chosen depth of the first charge-trapping layer 536a using thermal or radical oxidation. Radical oxidation may be performed, for example, at a temperature of 900-1100° C. using a single substrate tool, or 800-900° C. using a batch reactor tool. A mixture of $H_2$ and $O_2$ gasses may be introduced to a process chamber at a ratio of approximately 4:1 and 40-15 Torr using a single substrate tool, or a pressure of 300-500 Torr for a batch process, for a time of 4-2 minutes using a single substrate tool, or 30 min to 4 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ is permitted to react at a surface of the first charge-trapping layer 536a to form radicals, such as, an OH radical, an $HO_2$ radical or an O diradical, to form the middle oxide layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 5.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 5E, the number of dielectric layers further includes cap layer 538 formed on or overlying charge-trapping layer 536 or second charge-trapping layer 536b. In some embodiments, cap layer 538 is a multi-layer cap layer including at least a lower or first cap layer 538a overlying the charge-trapping layer 536, and a second cap layer 538b overlying the first cap layer 538a.

In one embodiment, first cap layer 538a may include a high-temperature-oxide (HTO), such as silicon oxide ($SiO_2$), having a thickness of between 2.0 nm and 4.0 nm deposited using a low pressure chemical vapor deposition (LPCVD) thermal oxidation process. For example, the oxidation process may include exposing the substrate 504 to a silicon source, such as silane, chlorosilane, or dichlorosilane, and an oxygen-containing gas, such as $O_2$ or $N_2O$ in a deposition chamber at a pressure of from about 50 mT to about 4000 mT, for a period of from about 40 minutes to about 420 minutes while maintaining the substrate at a temperature of from about 900° C. to about 4000° C. In some embodiments, the oxidation process is performed in-situ in the same process chamber as used to form second charge-trapping layer 536b, and immediately following the formation of second charge-trapping layer 536b.

In one embodiment, second cap layer 538b may include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures.

In some embodiments, first and second cap layers 538a and 538b may both include silicon nitride, a silicon-rich silicon nitride or a silicon-rich silicon oxynitride layer formed by CVD process using $N_2O/NH_3$ and $DCS/NH_3$ gas mixtures. First and second cap layers 538a, 538b, may or may not have the same stoichiometry.

Referring still to FIGS. 4 and 5E, a sacrificial oxide layer 540 is formed on or overlying cap layer 538. In one embodiment, sacrificial oxide layer 540 may include a high-temperature-oxide (HTO) layer grown by a thermal oxidation process or radical oxidation, and having a thickness of between 3.0 nm and 5.0 nm. In another embodiment, sacrificial oxide layer 540 may be formed or deposited by a chemical vapor deposition process in a low pressure chemical vapor deposition (LPCVD) chamber. For example, sacrificial oxide layer 540 may be deposited by a CVD process using a process gas including gas mixtures of silane or DCS and an oxygen containing gas, such as $O_2$ or $N_2O$, in ratios and at flow rates tailored to provide a silicon dioxide ($SiO_2$) sacrificial oxide layer 540.

Next, referring to FIGS. 4, 5E and 5F, a patterned triple gate (TG) mask layer 542 is formed on or overlying the sacrificial oxide layer 540, and the sacrificial oxide layer 540, cap layer 538 and charge-trapping layer 536, and tunnel-dielectric layer 528 disposed outside of the first region 510 are etched or patterned to form an NV gate stack 544 (step 410). Referring to FIG. 5F, the NV gate stack 544 may be disposed substantially overlying channel 532 of NVM transistor 506 in first region 510. The etching or patterning process may further remove various dielectric layers of NV gate stack 544 from second region 516 of substrate 504. The TG mask layer 542 may include a photoresist layer patterned using standard lithographic techniques, and the NV gate stack 544 layers in second region 516 may be etched or removed using a dry etch process including one or more separate steps to stop on a surface of the tunnel-dielectric 534 or pad oxide 518. In one embodiment, the etching may be configured to remove dielectric layers in NV gate stack in STIs 502 divot by introducing an isotropic component, and be stopped in second region 516 when a minimum of approximately 45 Å of pad oxide 518 remaining.

Referring to FIGS. 4 and 5H, the sacrificial oxide layer 540 and a top portion or substantially all of second cap layer 538b in the multi-layer cap layer 538 are removed from NV gate stack 544 in a highly selective cleaning process (step 412). This cleaning process further removes any oxide, such as oxide in tunnel-dielectric 534 and/or pad oxide 518, remaining in the first region 510 beyond NV gate stack 544, and in second region 516 to prepare substrate 504 for HV gate oxide (GOX) and blocking-dielectric growth. In one alternative embodiment, pad oxide 518 may not be removed entirely or at all. In one exemplary implementation, sacrificial oxide layer 540 and second cap layer 538b may be removed in a wet clean process using a 40:1 buffered oxide etch (BOE) containing a surfactant. Alternatively, the wet clean process can be performed using a 50:1 BOE wet etch, a 50:1 hydrofluoric (HF) wet etch, a pad etch, or any other similar hydrofluoric-based wet etching chemistry.

Next, referring to FIGS. 4 and 5I a thick oxide layer 546 is formed over the surface 520 of the substrate 504 to form a HV gate oxide (GOX) 548 for the HV_MOS 508 and an oxide layer of a blocking-dielectric 550 for the NVM transistor 506 (step 414). In one embodiment, as best illustrated in FIG. 5I, the process starts with forming a first oxide layer 546a using in-situ steam generation (ISSG) process. The ISSG process is advantageous because it has substantially no deleterious impact on a concentration of stoichiometric nitrogen near an interface of the blocking-dielectric 550 and the charge-trapping layer 536. Briefly, the ISSG process includes placing the substrate 504 in a process chamber, introducing a gas mixture comprising $O_2$ and $H_2$ into the process chamber at a pressure lower than about 10 Torr, and heating the surface of the substrate to a temperature of from about 800 to about 1100° C. for a predetermined time of from about 5 to about 60 minutes.

Next, referring to FIG. 5I a second oxide layer 546b is formed over the first oxide layer 546a using any suitable thermal oxidation process, including a wet or dry furnace oxidation process or Rapid Thermal Oxidation (RTO) process. For example, the thermal oxidation process can include a dry furnace oxidation process in which the substrate 504 is heated in a furnace or process chamber to a temperature of from about 800 C to about 1000° C. from about 5 to about 60 minutes in an oxygen containing atmosphere to a thickness of from about 10 nm to about 15 nm. Alternatively, the thermal oxidation process can include a RTO process in which the substrate 504 is heated is rapidly heated in a RTO process chamber to a temperature in the range of 1000-1100° C. while flowing oxygen ($O_2$) gas to maintain a pressure approximately in the range of 0.5-5 Torr for a time of from about 30 to about 300 seconds.

It is noted that while FIG. 5I shows a dashed line between the first oxide layer 546a and the second oxide layer 546b, no such physically discernable interface exists and the first and second oxide layers merge to form a single continuous, thicker layer of silicon dioxide of a substantially homogeneous composition.

It will be understood that although neither the ISSG nor the thermal oxidation processes alone will produce a HV GOX 548 sufficiently thick to enable high voltage operation of the HV_MOS 508, the ISSG process in combination with any of the above thermal oxidation processes will form such a HV GOX, and are fully compatible with SONOS fabrication, substantially without any negative impact on operation of the NVM transistor 506. In particular, it has been found that the ISSG process in combination with any of the above described thermal oxidation processes will produce a thick HV GOX 548 for the HV_MOS 508 having an overall thickness of from about 10 to about 15 nm, which is sufficient to enable high voltage operations with gate voltages ($V_{SG}$) voltages up to about 10V.

It will be further understood that although the step of forming the HV GOX 548 for the HV_MOS 508 and an oxide layer of the blocking-dielectric 550, step 414, has been described as having the ISSG oxidation process preceding the thermal oxidation process, the method of the present disclosure is not limited. In other embodiments, the sequence may be reversed, beginning with a thermal oxidation as described above followed by an ISSG oxidation process.

Referring to FIGS. 4 and 5J a patterned mask layer 552 is formed on or overlying at least NV gate stack 544 and HV GOX 548 in the first region 510 layer, and the portion of the thick oxide layer 546 overlying the channels 524 of I/O_MOS transistor 512 and LV_MOS transistor 514 in the second region 516 of substrate 504 is removed (step 416). As with the tunnel mask 528 and the TG mask layer 542, the patterned mask layer 552 may include a photoresist layer patterned using standard lithographic techniques, a hard mask layer, or other techniques known in the art. In one exemplary embodiment, HV gate oxide 546 layer may be removed in a wet clean process using a 40:1 buffered oxide etch (BOE) containing a surfactant. Alternatively, the wet clean process can be performed using a 50:1 BOE wet etch, a 50:1 hydrofluoric (HF) wet etch, or any other similar hydrofluoric-based wet etching chemistry. In one alternative embodiment, HV gate oxide 546 layer may be removed using a plasma etch process.

Referring to FIGS. 4 and 5K, an oxidation process is performed to form the I/O gate oxide layer 554 (step 418).

In one embodiment, the I/O gate oxide layer 554 may be formed by an ISSG process, as described above. Alternatively, the I/O gate oxide layer 554 can be formed using any of the wet or dry furnace or thermal oxidation processes described above. In either embodiment, whether formed by ISSG or thermal oxidation, the I/O gate oxide layer 554 has a thickness from about 30 Å to about 60 Å at or around the I/O_MOS 512 area. Additionally, it will be understood that either oxidation process used to form the I/O gate oxide layer 554 will also add thickness to the blocking-dielectric 550 and the HV_GOX 548.

Next, referring to FIGS. 4 and 5L a portion of the I/O gate oxide layer 554 overlying the LV_MOS 514 area is removed using an appropriately patterned mask (not shown) formed using standard photolithographic techniques, and oxide etching processes (step 420). A thin, interface oxide 556 that serves as a gate oxide for the LV_MOS 514 is then formed (step 422). Generally, the interface oxide 556 has a thickness from about 5 Å to about 10 Å at and may be formed by an ISSG process or any of the wet or dry thermal oxidation processes described above, as described above. Additionally, it will be understood that either oxidation process used to form the interface oxide 556 will also add a small thickness to the blocking-dielectric 550, the HV_GOX 548 and the I/O gate oxide layer 554.

Referring to FIGS. 4 and 5M, a high dielectric constant or high-K dielectric material or layer 558 is formed or deposited on or over at least one of the blocking-dielectric 550 and the HV_GOX 548 and in first region 510, and/or over the I/O gate oxide layer 554 and the interface oxide 556 in second region 516 (step 424). In one embodiment this deposition step will concurrently form a high-K, multilayer blocking dielectric 550' for the NVM transistor 506, and high-k multilayer gate dielectrics 548', 554' and 556' for MOS transistors 508, 512, and 514. The high-K dielectric layer 558 may include, but is not limited to, hafnium oxide, zirconium oxide, hafnium silicate, hafnium oxy-nitride, hafnium zirconium oxide and lanthanum oxide deposited to a physical thickness between about 3.0 nm and about 8.0 nm or other thicknesses by, for example, atomic layer deposition (ALD), physical vapor deposition (PVD), a chemical vapor deposition (CVD), a low pressure CVD (LPCVD) or a plasma enhanced CVD (PECVD) process.

Referring to FIGS. 4 and 5N, a polysilicon layer 560 is formed or deposited on or over the blocking-dielectric 550 and the HV_GOX 548 and in the first region 510, and over the I/O gate oxide layer 554 and the interface oxide 556 in the second region 516 (step 426). In one embodiment, the polysilicon layer 560 may be formed by chemical vapor deposition (CVD) to a thickness of from about 30 nm to about 100 nm, or other appropriate thicknesses. In other embodiments, the polysilicon layer 560 may be formed by other deposition methods or fabrication methods known in the art.

Next, referring to FIGS. 4 and 5O, a patterned photoresist mask (not shown) formed using standard lithographic techniques and the polysilicon gate layer 560 is etched to stop on surfaces of the high-K dielectric layer 558, thereby forming dummy or sacrificial polysilicon gates 560' for NVM transistor 506 and MOS transistors 508, 512, and 514 (step 428). In one embodiment, polysilicon gate layer 560 may be etched using standard polysilicon etch chemistries, such as $CHF_3$ or $C_2H_2$ or $HBr/O_2$ which are highly selective to the underlying high-K dielectric layer 558.

Still referring to FIGS. 4 and 5O, a first spacers 562 or offset spacers are formed adjacent to dummy polysilicon gates 560' for NVM transistor 506 and MOS transistors 508, 512, and 514 (step 428). In one embodiment, the first spacers 562 are formed by depositing a first spacer layer including silicon oxide or silicon nitride to a thickness of from about 10 nm to about 30 nm, using any known CVD technique as described herein, followed by an anisotropic spacer etch to yield the spacers as shown in FIG. 5O. Generally, the spacer etch can include any of the silicon oxide or silicon nitride etch processes described herein.

Subsequently, one or more lightly-doped drain extensions (LDDs 564) may be implanted adjacent to and extend under first sidewall spacers 562 of one or more of MOS transistors 508, 512, and 514 (step 428). In one embodiment, MOS LDDs 564 are formed by forming a photoresist mask through which selected transistors are exposed and implanting an appropriate ion species at an appropriate energy to an appropriate concentration. For example, drain extensions of P-type LV_MOS transistor 514, or any other P-type MOS transistors in the second region 516 may be formed by implanting boron ions ($BF_2$) at an energy of from about 10 to about 100 kilo-electron volts (keV), and a dose of from about 1e12 $cm^{-2}$ to about 5e14 $cm^{-2}$ through the photoresist mask (not shown). Optionally, pocket or halo implants (not shown) for a P-type LV_MOS transistor 514 or other P-type MOS transistors may also be done through the same photoresist mask, by implanting Arsenic or Phosphorus at energy of 20 to 70 kilo-electron volts (KeV) and a dose of 2e12 $cm^{-2}$ to about 5e12 $cm^{-2}$. Similarly, MOS LDDs 564 of N-type transistors, such as an N-type I/O_MOS transistor 512 and HV_MOS transistor 508 may be formed by implanting arsenic or phosphorus at energy of from about 10 to about 100 kilo-electron volts (keV), and a dose of from about 1e12 $cm^{-2}$ to about 5e14 $cm^{-2}$, also through an appropriately patterned photoresist mask. Halo or pocket implants for the N-type MOS transistors may also be done through this mask using Boron ($BF_2$) at energy of 5 to about 50 kilo-electron volts and a dose of 1e12 $cm^{-2}$ to 5e12 $cm^{-2}$.

Next, referring to FIGS. 4 and 5P, the high-K layer 558, oxide layers 554, 556 and 546, as well as the nitride CTL 536 and tunnel dielectric layer 534, exposed between the dummy polysilicon gates 560' are etched, and one or more lightly-doped drain extensions (SONOS LDDs 566) implanted adjacent to and extend under first sidewall spacers 562 of the NVM transistor 506 (step 430). The etch can be accomplished using one or more dry or wet etch processes to stop on the surface 520 of the substrate 504 as shown in FIG. 5P. In some embodiments, the dry or wet etch may also be used to remove any remaining high-K dielectric layer 558 or ONO layers of the NVM transistor 506 in the first region 510 extending beyond the first spacers 562.

The SONOS LDDs 566 for the NVM transistor 506 may be formed by depositing and patterning a same photoresist mask (not shown) covering the MOS transistors 508, 512, and 514, and using techniques substantially the same as those described above with respect to the MOS LDDs 564 implants. For example, in one embodiment, the SONOS LDDs 566 may be formed by an angled implant of, for example, arsenic or phosphorous at an energy of from about 5 to about 25 kilo-electron volts (keV), and a dose of from about 5e12 $cm^{-2}$ to about 2e14 $cm^{-2}$. Optionally, pocket or halo implants may be formed by implanting ($BF_2$) with energy of 10 to 30 kilo-electron volts and a dose of 1e12 $cm^{-2}$ to 3e12 $cm^{-2}$.

Referring to FIGS. 4 and 5Q, a second spacer layer is deposited and etched to form second sidewall spacers 568 adjacent to first sidewall spacers 562 and gate stacks of the NVM transistor 506 and MOS transistors 508, 512, and 514, source and drain (S/D) implants are performed to form S/D regions 570 for all transistors and a silicide process performed to form silicide regions 572 (step 432). In one embodiment, a hard mask (not shown) may be formed and patterned to expose only the S/D regions 570 of P-type transistors, such as P-type LV_MOS 514, or other P-type transistors in first and second regions 510, 516. Generally, the silicide regions 572 may be formed on exposed S/D regions 570. The silicide process may be any commonly employed in the art, typically including a pre-clean etch, cobalt or nickel metal deposition, anneal and wet strip. In one embodiment, a rapid thermal annealing (RTA) may be performed on the S/D regions 570 before silicide formation process. In one embodiment, prior to the silicide process, a cleaning process may be performed to remove any remaining oxides, such as in in tunnel-dielectric 534 and/or the pad oxide layer 518 on the substrate surface 520 beyond the transistors 506, 508, 512 and 514 formed in the first and second regions 510, 516. As depicted in FIG. 5Q and described above the NVM transistor 506 and the HV_MOS 508 select transistor can share an S/D drain region 570 and a silicide region 572' disposed therebetween.

Referring to FIGS. 4 and 5R, the method further includes forming a stress inducing liner or layer 574, such as a stress inducing nitride layer, and depositing an interlevel dielectric (ILD) layer 576 over substantially the entire surface 520 of substrate 504 and all layers and structures formed thereon (step 434). The stress inducing layer 574 may include, a compressive or tensile nitride layer formed using a plasma enhanced chemical vapor deposition (PECVD) or a Bis-TertiaryButylAminoSilane (BTBAS) nitride layer, deposited or grown to a thickness of from about 30 nm to about 70 nm or other thicknesses, using any known technique including CVD. The ILD layer 576 may include, for example, silicon oxide, deposited or grown to a thickness of from about 0.5 μm to about 1.0 μm or other thicknesses, using any known CVD technique as described above.

Next, referring to FIGS. 4 and 5S, a chemical mechanical planarization (CMP) process is performed to planarizing the ILD layer 576, exposing the dummy polysilicon gates 560', and the dummy polysilicon gates removed (step 436). As best illustrated in FIG. 5S, a single CMP process is performed to expose all targeted dummy polysilicon gates 560'. Due to the possible difference in heights, different transistors may have different thicknesses of remaining dummy poly gates 560' after the CMP process. In one embodiment, the dummy polysilicon gates 560' may be removed using standard polysilicon etch methods that are known in the art, which are highly selective to the material of high-K dielectric layer 558, ILD layer 576, stress inducing layer 574, first and second sidewall spacers 562, 568. In an alternative embodiment, one or more dummy polysilicon gates 560' in the NVM transistor 506 and/or MOS transistors 508, 512, and 514 may not be removed, in cases wherein a polysilicon gate is preferred over a metal gate.

Referring to FIGS. 4 and 5T, metal gates 578 are formed for one or more of the NVM transistor 506 and/or MOS transistors 508, 512, and 514 by depositing one or more layers of metal, etching the metal layer(s) to remove excess metal in unwanted areas, and performing a CMP process to planarize the newly formed metal gates and ILD layer 576 (step 438). In one embodiment, first or P+ metal layer (high work function metal) is deposited over substantially the entire surface 520 of the substrate 504 and all layers and structures formed thereon, a patterned photoresist mask (not shown) formed using standard lithographic techniques and the P+ metal layer etched to remove first or P+ metal layer from N-type NVM transistor(s) in the first region 510 and N-type MOS transistors 508, 512, and 514, stop on surfaces of the high-K dielectric layer 558, thereby forming high work function gate for any P-type NVM transistor(s) and P-type MOS transistor(s), such as a P-type LV_MOS transistor 514 in FIG. 5T. The P+ metal layer may include aluminum, titanium or compounds or alloys thereof, deposited to a thickness of from about 20 nm to about 100 nm or other thicknesses, using physical or chemical vapor deposition. In one embodiment, P+ metal layer may be formed overlying high-K dielectric layers 558, and optionally on sidewalls, of the openings previously occupied by dummy polysilicon gates 560'. The P+ metal layer formed over N-type MOS transistors may then be removed, second or N+ metal layer (low work function) is deposited over substantially the entire surface 520 of the substrate 504. A patterned photoresist mask (not shown) is then formed and the N+ metal layer etched to form a non-high or low work function metal gate for any N-type transistors in the first and second regions 510 and 516, such as an N-type NVM transistor 506, HV_MOS transistor 508, and I/O_MOS transistor 512 as best shown in FIG. 5T. The N+ metal layer may include titanium, lanthanum, aluminum, or compounds or alloys thereof, deposited to a thickness of from about 20 nm to about 100 nm or other thicknesses, using physical or chemical vapor deposition. In general, any N-type transistor may include a low work function metal layer, such as titanium, lanthanum or aluminum, and any P-type transistor may include a high work function metal layer, such as aluminum or titanium. In one alternative embodiment, an N-type NVM transistor 506 may include high work function metal layer, such as P+ metal layer instead. The incorporation of the high work function metal layer in an N-type NVM transistor 506 may provide improved erase performance to the device as it may avoid erase saturation.

Referring to FIGS. 4 and 5U a second ILD layer 580 may be deposited (step 440). In one embodiment, the second ILD layer 580 may include, for example, silicon oxide or silicon nitride, deposited or grown to a thickness of from about 0.5 μm to about 1 μm or other thicknesses, using any known CVD as described above. Optionally, second ILD layer 580 may be a stress inducing layer or structure, such as a stress inducing nitride layer, over NVM transistor 506 to increase data retention and/or to improve programming time and efficiency. In particular, inducing stress into the charge-trapping layer 536 of the NVM transistor 506 changes energy levels of charge traps formed therein, thereby increasing charge retention of the charge-trapping layer. In addition, forming a stress inducing second ILD layer 580 or structure, in or on the surface 520 of the substrate 504 proximal to, and preferably surrounding, a region of the substrate in which the channel 532 of NVM transistor 506 is formed will reduce the band gap, and, depending on the type of strain, increases carrier mobility. For example, tensile strain, in which inter-atomic distances in the crystal lattice of the substrate 504 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 506.

Finally, referring to FIG. 4 a standard or baseline CMOS process flow is continued to substantially complete the front end fabrication of the NVM device 500 yielding the structure shown in FIG. 5V (step 442). In one embodiment, the CMOS process flow may include planarization of the second ILD layer 580 by a CMP process, followed forming first contacts 582a extending through the first and second ILD layers 576, 580, to electrically couple to the S/D regions 570 through the silicide regions 572 and forming second contacts 582b extending through the second ILD layer 580 to electrically couple to the metal gates 578. The first and second contacts 582a and 582b may be formed by forming a patterned photoresist mask over the second ILD layer 580, etching the second ILD layer using any of the standard oxide etch processes as described above to stop on the silicide regions 572 and metal gates 578, and filling the contact openings using metals and processes similar to those described to form the metal gates.

Thus, a multi-level NVM device including SONOS type NVM transistors and other HV and LV transistors integrally and concurrently formed therewith have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A method of fabricating a semiconductor device comprising:
    forming a tunnel-dielectric for a memory transistor over a surface of a substrate;
    forming a charge-trapping layer comprising a nitride over the tunnel-dielectric;
    forming a cap layer directly over the charge-trapping layer and a sacrificial oxide layer over the cap layer;
    patterning the tunnel-dielectric, the charge-trapping, sacrificial oxide, and cap layers to form a non-volatile (NV) gate stack, wherein the sacrificial oxide and cap layers are completely removed beyond the NV gate stack;
    removing the sacrificial oxide layer completely and the cap layer at least partially from the NV gate stack; and forming a first gate-dielectric for a first field-effect transistor (FET) over the surface of the substrate, wherein forming the first gate-dielectric comprises performing a number of oxidation processes to form a thick gate-oxide (GOX) while concurrently forming a blocking-dielectric comprising a first oxide layer over the charge-trapping layer of the memory transistor, including performing an in-situ-steam-generation (ISSG) process to form the thick GOX and the first oxide layer of the blocking-dielectric, followed by performing a thermal oxidation process to increase a thickness of the thick GOX and the first oxide layer.

2. The method of claim 1 wherein the thermal oxidation process is a rapid thermal oxidation (RTO), a dry furnace oxidation process, or a wet furnace oxidation process.

3. The method of claim 1 wherein performing the number of oxidation processes comprises performing a thermal oxidation process followed by an in-situ-steam-generation (ISSG) process to form the first oxide layer of the blocking-dielectric while increasing a thickness of the thick GOX.

4. The method of claim 1 wherein forming the first gate-dielectric and forming the blocking-dielectric further comprises depositing a high dielectric constant (high-K) material over the thick GOX and the first oxide layer.

5. The method of claim 4 wherein the first gate-dielectric is a high voltage (HV) gate-dielectric having a total thickness in a range of 100 to 130 angstroms (Å).

6. The method of claim 4 further comprising forming a first metal gate over the blocking-dielectric of the memory transistor and a second metal gate over the first gate-dielectric of the first FET.

7. The method of claim 4 further comprising prior to depositing the high-K material performing an additional oxidation process to form a second oxide layer of a second gate-dielectric for a second FET, wherein performing the additional oxidation process increases a thickness of the thick GOX and the first oxide layer.

8. The method of claim 7 wherein depositing the high-K material further comprises depositing the high-K material over the second oxide layer to form the second gate-dielectric for the second FET.

9. The method of claim 8 further comprising forming a metal gate over the second gate-dielectric of the second FET.

10. The method of claim 1 wherein the first FET is a select transistor of a 2T memory cell and is formed adjacent to the memory transistor.

11. The method of claim 1 wherein the first FET is a select transistor of a 2T multi-level memory cell (MLC) and is formed adjacent to the memory transistor, and wherein the first gate-dielectric has a thickness sufficient to enable the MLC to operate at voltages of at least 10V.

12. A method of fabricating a 2T multi-level memory cell (MLC), the method comprising:

forming a tunnel-dielectric for a memory transistor over a surface of a substrate;

forming a charge-trapping layer comprising a nitride over the tunnel-dielectric;

forming a cap layer directly over the charge-trapping layer and a sacrificial oxide layer over the cap layer;

patterning the tunnel-dielectric, the charge-trapping, sacrificial oxide, and cap layers to form a non-volatile (NV) gate stack, wherein the sacrificial oxide and cap layers are completely removed beyond the NV gate stack;

removing the sacrificial oxide layer completely and the cap layer at least partially from the NV gate stack;

performing an in-situ-steam-generation (ISSG) process to form a first oxide layer of a blocking-dielectric over the charge-trapping layer and to concurrently form a second oxide layer of a gate-dielectric for a first field-effect transistor (FET) over the surface of the substrate; and performing, subsequent to the ISSG process, a thermal oxidation process to increase a thickness of the first oxide layer and the second oxide layer.

13. The method of claim 12 further comprising depositing a high dielectric constant (high-K) material to concurrently form a first high-K layer on the first oxide layer of the blocking-dielectric and a second high-K layer on the second oxide layer of the gate-dielectric.

14. The method of claim 13 further comprising forming a first metal gate over blocking-dielectric for the memory transistor and a second metal gate over the gate-dielectric of the first FET.

15. The method of claim 12 wherein the thermal oxidation process is a rapid thermal oxidation (RTO).

16. The method of claim 12 wherein the thermal oxidation process is a wet or dry furnace oxidation process.

17. A method of fabricating a memory transistor comprising:

forming a tunnel-dielectric over a surface of a substrate;

forming a nitride charge-trapping layer over the tunnel-dielectric;

forming a cap layer directly over the nitride charge-trapping layer and a sacrificial oxide layer over the cap layer;

patterning the tunnel-dielectric, the nitride charge-trapping, sacrificial oxide, and cap layers to form a non-volatile (NV) gate stack, wherein the sacrificial oxide and cap layers are completely removed beyond the NV gate stack;

removing the sacrificial oxide layer completely and the cap layer at least partially from the NV gate stack; and performing an in-situ-steam-generation (ISSG) process to form a first oxide layer of a blocking-dielectric over the nitride charge-trapping layer, followed by a thermal oxidation process to increase a thickness of the first oxide layer, wherein the forming and increasing the thickness of the first oxide layer does not alter a substantially uniform stoichiometric concentration of nitrogen across a thickness of the nitride charge-trapping layer from the tunnel-dielectric to the blocking-dielectric.

18. The method of claim 17 further comprises depositing a high dielectric constant (high-K) material over the oxide layer to form a high-K blocking-layer.

19. The method of claim 18 further comprising forming a metal gate over the high-K blocking-layer to form a high-K metal gate (HKMG) memory transistor.

20. The method of claim 17 wherein forming the nitride charge-trapping layer comprises forming a bi-layer nitride charge-trapping layer including a silicon-rich and oxygen-rich bottom oxynitride layer over the tunnel-dielectric and a silicon-rich, oxygen-lean top nitride layer overlying the bottom oxynitride layer.

21. The method of claim 20 wherein forming the bi-layer nitride charge-trapping layer further comprises forming a thin oxide between the bottom oxynitride layer and the top nitride layer.

* * * * *